(12) United States Patent
Liu et al.

(10) Patent No.: US 12,159,886 B2
(45) Date of Patent: Dec. 3, 2024

(54) UNEQUAL CMOS IMAGE SENSOR PIXEL SIZE TO BOOST QUANTUM EFFICIENCY

(71) Applicant: Taiwan Semiconductor Manufacturing Co., Ltd., Hsinchu (TW)

(72) Inventors: Ming Chyi Liu, Hsinchu (TW); Hung-Shu Huang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 320 days.

(21) Appl. No.: 17/361,785

(22) Filed: Jun. 29, 2021

(65) Prior Publication Data
US 2022/0320160 A1   Oct. 6, 2022

Related U.S. Application Data

(60) Provisional application No. 63/168,840, filed on Mar. 31, 2021.

(51) Int. Cl.
*H01L 27/146*   (2006.01)

(52) U.S. Cl.
CPC .. *H01L 27/14607* (2013.01); *H01L 27/14621* (2013.01); *H01L 27/14627* (2013.01); *H01L 27/1463* (2013.01); *H01L 27/1464* (2013.01); *H01L 27/14645* (2013.01); *H01L 27/14685* (2013.01); *H01L 27/14689* (2013.01)

(58) Field of Classification Search
CPC ................ H01L 27/1463; H01L 27/14607
See application file for complete search history.

(56) References Cited

U.S. PATENT DOCUMENTS

| 10,615,207 | B2 * | 4/2020 | Okazaki | H01L 27/1463 |
| 2006/0145057 | A1 | 7/2006 | Kim | |
| 2010/0009493 | A1 | 1/2010 | Kim et al. | |
| 2011/0073823 | A1 * | 3/2011 | Mitrovic | E04H 17/1439 256/65.01 |
| 2015/0008553 | A1 * | 1/2015 | Choi | H01L 27/1464 257/432 |
| 2015/0228684 | A1 * | 8/2015 | Yamashita | H01L 27/14641 257/292 |
| 2016/0380032 | A1 | 12/2016 | Park et al. | |
| 2017/0133414 | A1 * | 5/2017 | Chiang | H01L 27/14689 |
| 2019/0035838 | A1 | 1/2019 | Byun | |
| 2020/0219920 | A1 * | 7/2020 | Hur | H01L 27/14623 |
| 2021/0202546 | A1 * | 7/2021 | Liu | H01L 27/1463 |
| 2022/0173138 | A1 * | 6/2022 | Yang | H01L 27/1463 |

\* cited by examiner

*Primary Examiner* — Ali Naraghi
(74) *Attorney, Agent, or Firm* — Eschweiler & Potashnik, LLC

(57) ABSTRACT

In some embodiments, the present disclosure relates to an image sensor, including a semiconductor substrate, a plurality of photodiodes disposed within the semiconductor substrate, and a deep trench isolation structure separating the plurality of photodiodes from one another and defining a plurality of pixel regions corresponding to the plurality of photodiodes. The plurality of pixel regions includes a first pixel region sensitive to a first region of a light spectrum, a second pixel region sensitive to a second region of the light spectrum, and a third pixel region sensitive to a third region of the light spectrum. The first pixel region is smaller than the second pixel region or the third pixel region.

20 Claims, 16 Drawing Sheets

UNEQUAL CMOS IMAGE SENSOR PIXEL SIZE TO BOOST QUANTUM EFFICIENCY

REFERENCE TO RELATED APPLICATION

This Application claims the benefit of U.S. Provisional Application No. 63/168,840, filed on Mar. 31, 2021, the contents of which are hereby incorporated by reference in their entirety.

BACKGROUND

Many modern day electronic devices, such as digital cameras and video cameras, contain image sensors to convert optical images to digital data. To achieve this, an image sensor comprises an array of pixel regions. Each pixel region contains a photodiode configured to capture optical signals (e.g., light) and convert it to digital data (e.g., a digital image). Complementary metal-oxide-semiconductor (CMOS) image sensors are often used over charge-coupled device (CCD) image sensors because of their many advantages, such as lower power consumption, faster data processing, and lower manufacturing costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
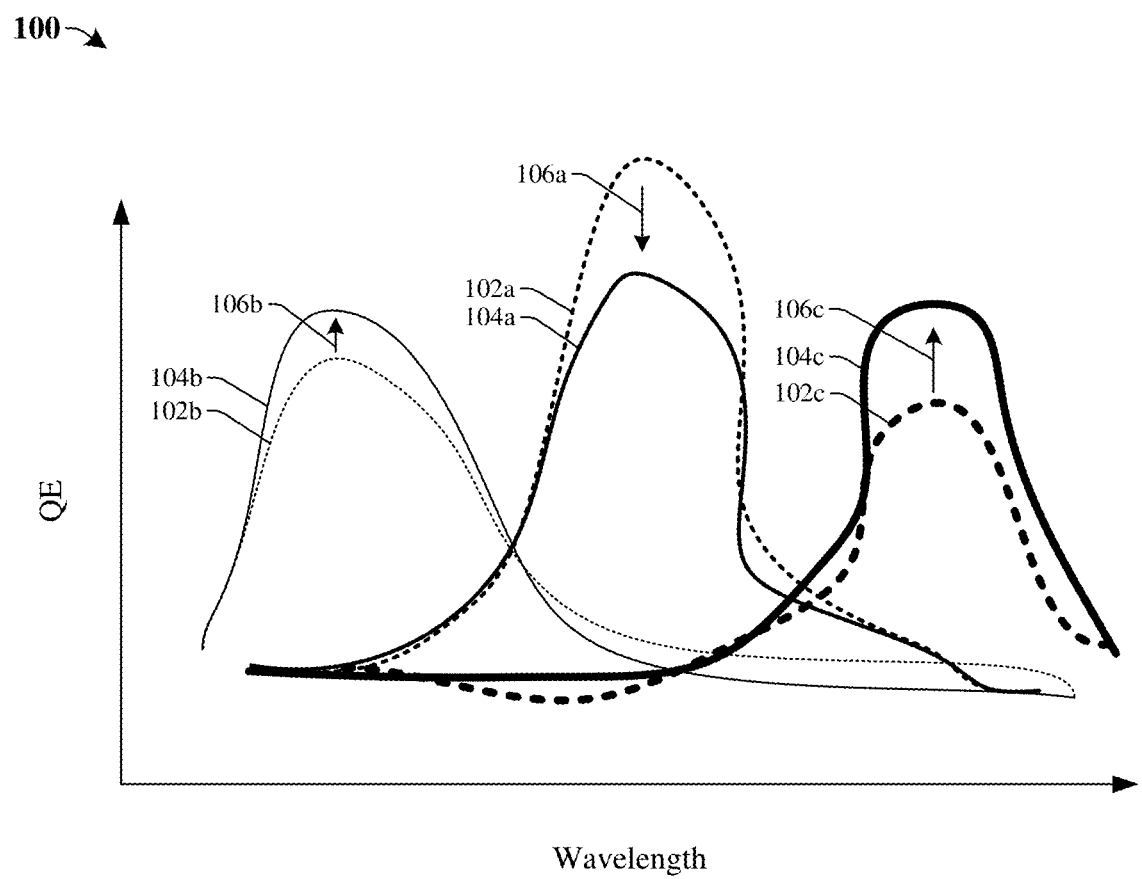
FIG. 1 illustrates a graphical representation of some embodiments of a relationship between quantum efficiency and wavelength for pixels sensitive to different regions of the light spectrum.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An image sensor comprises a plurality of pixel regions defined by a deep trench isolation structure and a metal grid. Each pixel region contains a photodiode configured to capture an optical image (e.g., light) and convert it to digital data (e.g., a digital image). Each pixel region comprises a color filter overlying the photodiode and configured to filter a portion of the optical image to a certain region of the visual light spectrum. For example, some pixel regions may be configured to be sensitive to green light, some pixel regions may be configured to be sensitive to blue light, and some pixel regions may be configured to be sensitive to red light. By having pixel regions to measure the intensity of different regions of the light spectrum for the various colors, color information of the optical image can be acquired.

During operation, each pixel region receives incident photons through the color filter, and the photodiode converts the incident photons to output electrons. The ratio of output electrons to incident photons defines a quantum efficiency of the pixel region. A size of the pixel region impacts how many incident photons are received by the photodiode. Some pixel regions are sensitive to colors corresponding to wavelengths with a greater quantum efficiency (e.g., strong pixels), and some pixel regions are sensitive to colors corresponding to wavelengths with a smaller quantum efficiency (e.g., weak pixels). Thus, strong pixels of a certain size may have a greater quantum efficiency than weak pixels of the same size, which leads to an unevenly distributed quantum efficiency across pixels of the image sensor.

The present application, in some embodiments, is directed to an image sensor comprising pixel regions of different shapes and/or unequal sizes. Pixel regions sensitive to certain colors corresponding to wavelengths with a greater quantum efficiency (e.g., strong pixels) are made smaller, and pixel regions sensitive to certain colors corresponding to wavelengths with a smaller quantum efficiency (e.g., weak pixels) are enlarged.

FIG. 1 illustrates a graphical representation 100 of some embodiments of a relationship between quantum efficiency and wavelength for pixels sensitive to different regions of the light spectrum. Lines 102a, 102b, 102c represent an image sensor comprising pixels of equal sizes. Line 102a represents pixels sensitive to a first region of a light spectrum (e.g., green light), line 102b represents pixels sensitive to a second region of the light spectrum (e.g., blue light), and line 102c represents pixels sensitive to a third region of the light spectrum (e.g., red light). Pixels associated with line 102*b* and line 102*c* have a quantum efficiency smaller than that of pixels associated with line 102*a*.

Lines 104*a*, 104*b*, 104*c* represent an image sensor comprising pixels of different shapes and/or different sizes. Line 104*a* represents pixels sensitive to the first region of the light spectrum and smaller in size than the pixels associated with line 102*a*. Line 104*b* represents pixels sensitive to the second region of the light spectrum and larger in size than the pixels associated with line 102*b*. Line 104*c* represents pixels sensitive to the third region of the light spectrum and larger in size than the pixels associated with line 102*c*. In some embodiments, pixels associated with line 104*b* are a same size as pixels associated with line 104*c*.

By enlarging the pixels sensitive to the second and third regions of the light spectrum, the total area of the pixels increases, thus fewer incident photons are reflected, and more incident photons can be converted into output electrons, thus quantum efficiency increases (see lines 106*b* and 106*c*). Similarly, by making pixels sensitive to the first region of the light spectrum smaller, the total area of the pixels decreases, thus more incident photons are reflected, and fewer incident photons can be converted into output electrons, thus quantum efficiency decreases (see line 106*a*). Lines 104*a*, 104*b*, and 104*c* have more evenly distributed quantum efficiencies than lines 102*a*, 102*b*, and 102*c*. Better device performance may be achieved by distributing quantum efficiency more evenly across pixels.

As illustrated by FIG. 1, by decreasing the size of the pixels sensitive to the first region of light, the quantum efficiency of strong pixels drops slightly from line 102*a* to 104*a* (see line 106*a*); and conversely, by increasing the size of the pixels sensitive to the second and third regions of light, the quantum efficiency of weak pixels rises slightly from lines 102*b*, 102*c* to lines 104*b*, 104*c* (see lines 106*b* and 106*c*). As an example, the strong pixels may be sensitive to a green region of the visual light spectrum, and the weak pixels may be sensitive to a blue or red region of the visual light spectrum. By enlarging pixel regions sensitive to certain colors corresponding to wavelengths with a smaller quantum efficiency, the total area of the enlarged pixel regions increases, thus fewer incident photons are reflected, and more incident photons can be converted into output electrons, thus quantum efficiency increases. Similarly, by making pixel regions sensitive to certain colors corresponding to wavelengths with a greater quantum efficiency smaller, the total area of the smaller pixel region decreases, thus more incident photons are reflected, and fewer incident photons can be converted into output electrons, thus quantum efficiency decreases. As illustrated in FIG. 1, lines 104*a*, 104*b*, and 104*c* have more evenly distributed quantum efficiencies than lines 102*a*, 102*b*, and 102*c*, leading to a lower signal-to-noise ratio of the image sensor and thus a better performance of the image sensor. For example, in some embodiments, the areas of a first pixel sensitive to the first region of light, a second pixel sensitive to the second region of light, and a third pixel sensitive to the third region of light may be sized so the quantum efficiencies of the first pixel, the second pixel, and the third pixel are each within +/−10% of one another to distribute quantum efficiency relatively evenly across the pixels.

Figure 2:
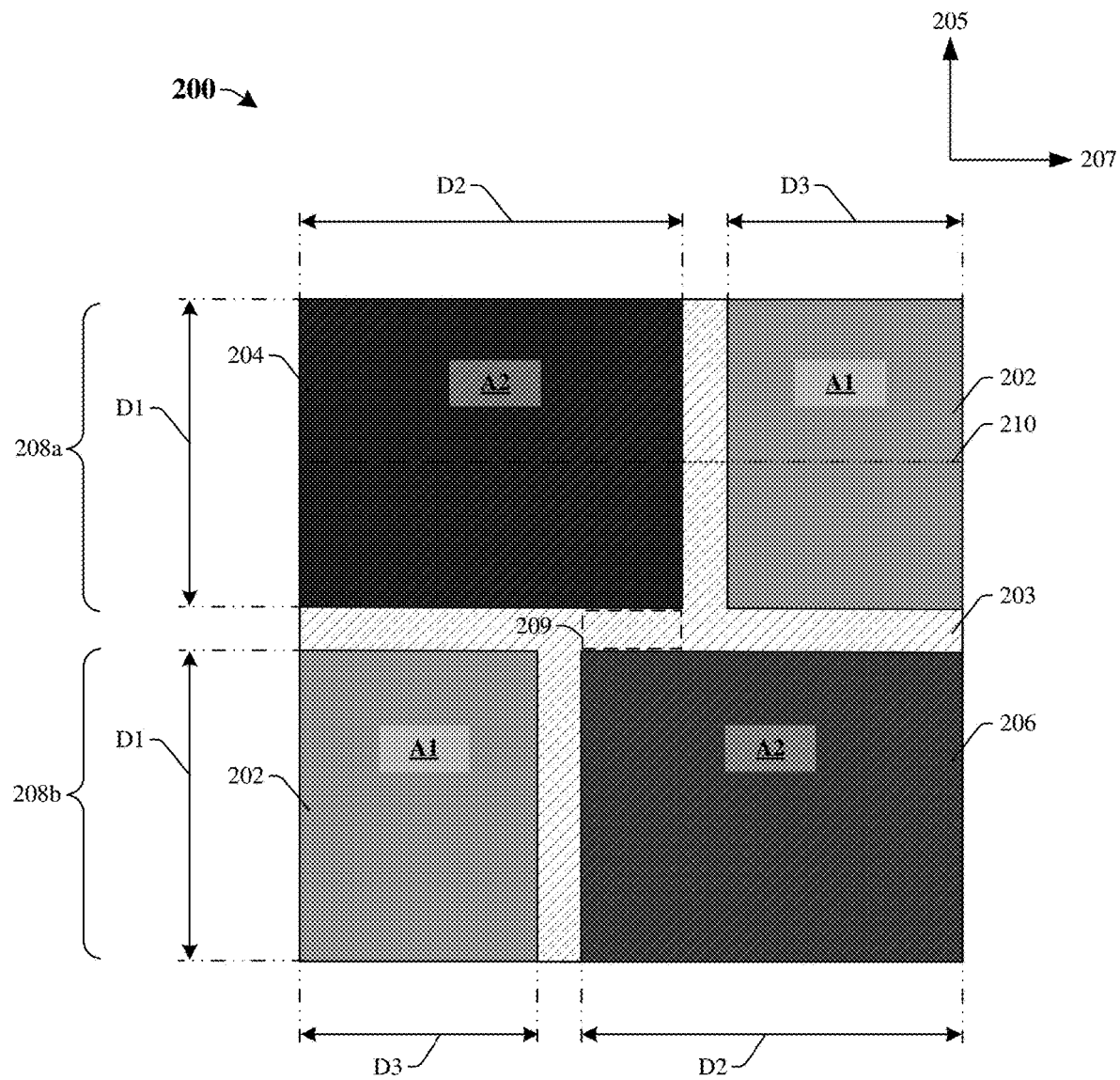
FIG. 2 illustrates a top view of some embodiments of an image sensor comprising a plurality of pixel regions of different shapes and/or unequal sizes.

FIG. 2 illustrates a top view 200 of some embodiments of an image sensor comprising a plurality of pixel regions of different shapes and/or unequal sizes. A first pixel region 202 is sensitive to a first region of the light spectrum, such as a green region of the spectrum. A second pixel region 204 is sensitive to a second region of the light spectrum, such as a blue region of the spectrum. A third pixel region 206 is sensitive to a third region of the light spectrum, such as a red region. In alternative embodiments, the first region of the light spectrum may be a cyan region, the second region of the light spectrum may be a magenta region, and the third region of the light spectrum may be a yellow region. The plurality of pixel regions is arranged into a first row of pixel regions 208*a* and a second row of pixel regions 208*b* extending in a first direction 205. The first row of pixel regions 208*a* comprises the first pixel region 202 and the second pixel region 204 alternating in the first direction 205. The second row of pixel regions 208*b* extends in the first direction 205 and comprises the first pixel region 202 and the third pixel region 206 alternating in the first direction 205.

The first pixel region 202, the second pixel region 204 and the third pixel region 206 respectively extend a first distance D1 in the first direction 205. The second pixel region 204 and the third pixel region 206 respectively extend a second distance D2 in a second direction 207 substantially orthogonal to the first direction 205. The second distance D2 is different than the first distance D1. The first pixel region 202 extends a third distance D3 in the second direction 207, wherein the third distance D3 is different than the first distance D1 and less than the second distance D2. The first direction 205 and the second direction 207 define a plane that is parallel to a top surface of a semiconductor substrate (not shown) in which the plurality of pixel regions is disposed.

In some embodiments, the first distance D1 may range from approximately 0.1 micrometers to approximately 100 micrometers. In some embodiments, the second distance D2 may range from approximately 0.1 micrometers to approximately 100 micrometers. In some embodiments, the third distance D3 may range from approximately 0.1 micrometers to approximately 100 micrometers.

The first pixel region 202 has a first area A1. The second pixel region 204 and the third pixel region 206 each have a second area A2 that is larger than the first area A1. Since the first region of the light spectrum corresponds to a wavelength with a greater quantum efficiency than those corresponding to the second and third regions of the light spectrum, the second area A2 is larger than the first area A1 to decrease a quantum efficiency of the first pixel region 202 and to increase a quantum efficiency of the second pixel region 204 and a quantum efficiency of the third pixel region 206. Thus, the arrangement of FIG. 2 achieves a better device performance compared to image sensors comprising pixels of equal sizes by distributing quantum efficiency more evenly across pixels. In alternative embodiments, the first pixel region 202 of first row of pixel regions 208*a* may have a different area than the first pixel region 202 of the second row of pixel regions 208*b*. In further embodiments, the second pixel region 204 may have a different area than the third pixel region 206.

In some embodiments, the second area A2 may range from approximately 1% to approximately 50% larger than the first area A1, from approximately 5% to approximately 20% larger than the first area A1, from approximately 10% to approximately 30% larger than the first area A1, or some other suitable value. In some embodiments, if the second area A2 is not large enough compared to the first area A1 (e.g., less than 1% larger), the quantum efficiency of the second pixel region 204 and the quantum efficiency of third pixel region 206 may not be evenly distributed enough with the quantum efficiency of the first pixel region 202 to have improvements in device performance. In some embodiments, if the second area A2 is too large compared to the first area A1 (e.g., more than 50% larger), the quantum efficiencies of the second pixel region 204 and the third pixel region 206 may exceed the quantum efficiency of the first pixel region 202 by too much, and thus the quantum efficiency across pixels may not be evenly distributed enough to have improvements in device performance. In some embodiments, a first ratio of the first area A1 to the second area A2 is within a range of approximately 90% to approximately 110% of one another, approximately 95% to approximately 105% of one another, or some other suitable value of a second ratio of the quantum efficiency for the first pixel region 202 to the quantum efficiency for the second pixel region 204 or the quantum efficiency of the third pixel region 206.

In some embodiments, respective pixel regions of the plurality of pixel regions are separated from one another by a deep trench isolation structure 203. In some of such embodiments, the second pixel region 204 shares a common portion 209 of the deep trench isolation structure 203 with the third pixel region 206, and wherein the common portion 209 of the deep trench isolation structure 203 extends in the first direction 205.

FIGS. 3-6 illustrate top views of some alternative embodiments of the image sensor of FIG. 2.

Figure 3:
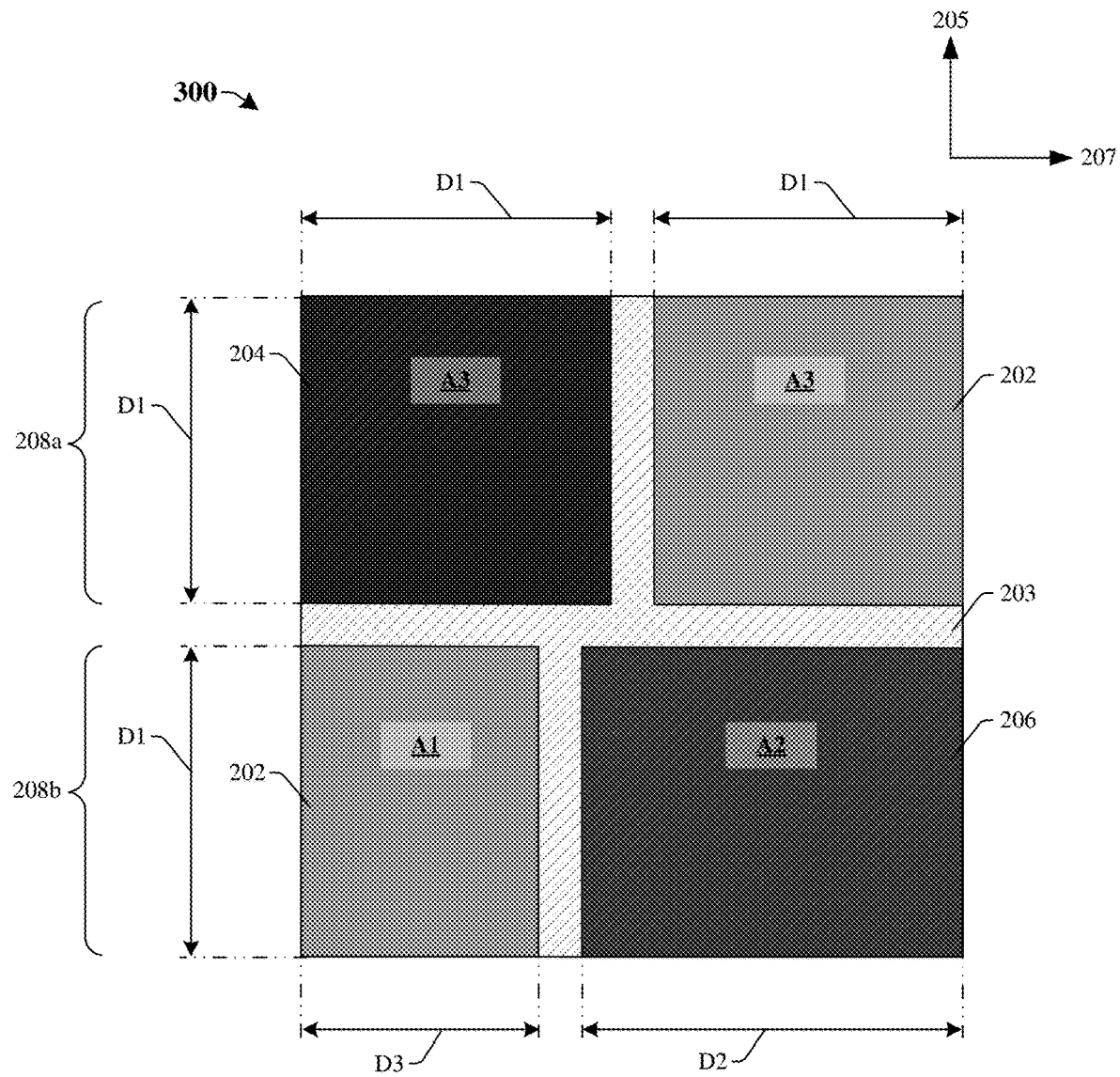
FIGS. 3-6 illustrate top views of some alternative embodiments of the image sensor of FIG. 2.

As illustrated by top view 300 of FIG. 3, the first row of pixel regions 208a has pixel regions of equal sizes and the second row of pixel regions 208b has pixel regions of different shapes and/or unequal sizes. The first pixel region 202 of the second row of pixel regions 208b has the first area A1 and the third pixel region 206 of the second row of pixel regions 208b has the second area A2. The first pixel region 202 and the second pixel region 204 of the first row of pixel regions 208a each have a third area A3. The third area A3 is greater than the first area A1 and less than the second area A2. In some embodiments, the first pixel region 202 and the second pixel region 204 of the first row of pixel regions 208a extend the first distance D1 in the second direction 207.

Figure 4:
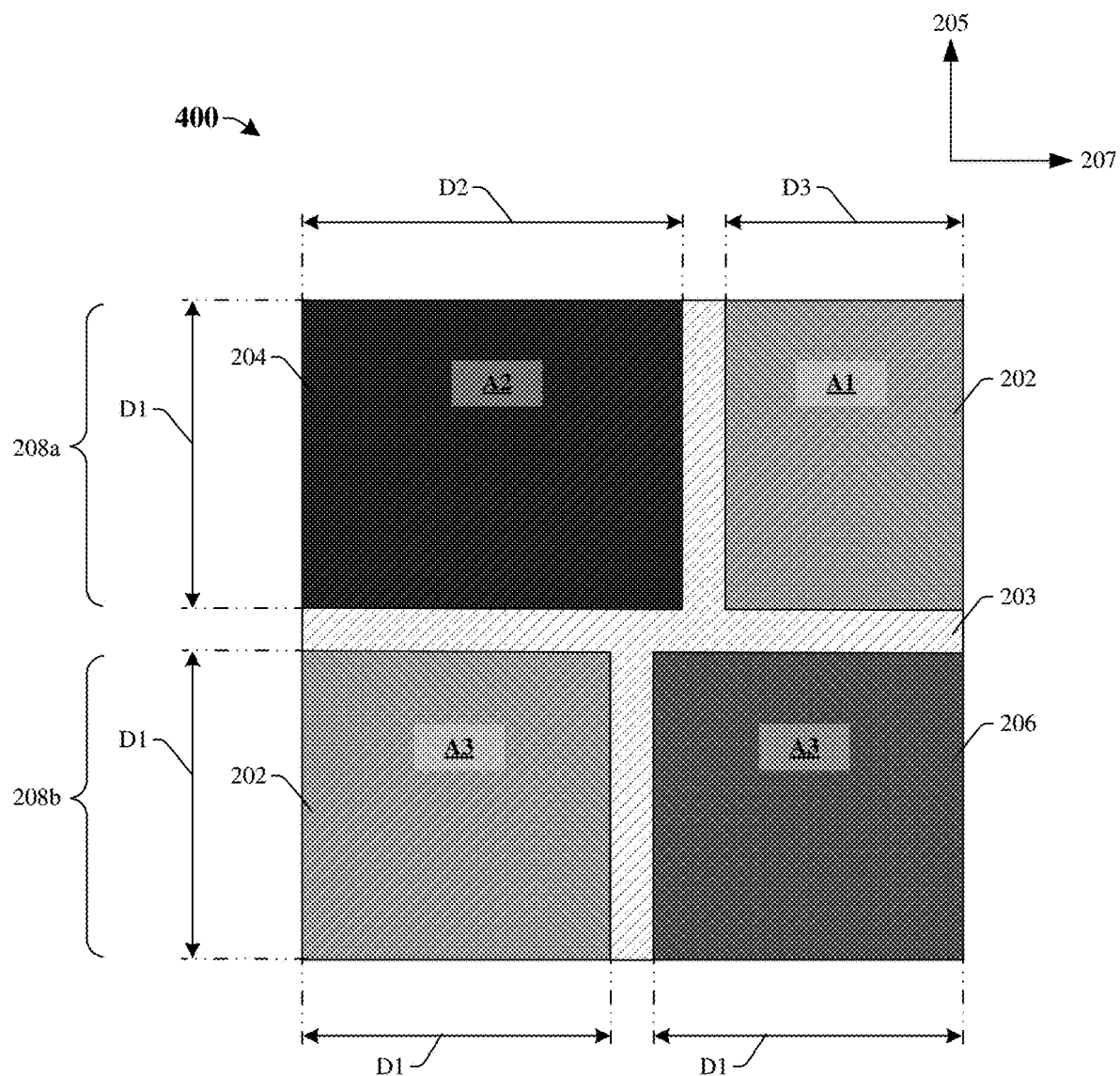

As illustrated by top view 400 of FIG. 4, the first row of pixel regions 208a has pixel regions of different shapes and/or unequal sizes and the second row of pixel regions 208b has pixel regions of equal sizes. The first pixel region 202 of the first row of pixel regions 208a has the first area A1 and the second pixel region 204 of the first row of pixel regions 208a has the second area A2. The first pixel region 202 and the third pixel region 206 of the third row of pixel regions 208a each have a third area A3. The third area A3 is greater than the first area A1 and less than the second area A2. In some embodiments, the first pixel region 202 and the third pixel region 206 of the second row of pixel regions 208b extend the first distance D1 in the second direction 207.

Figure 5:
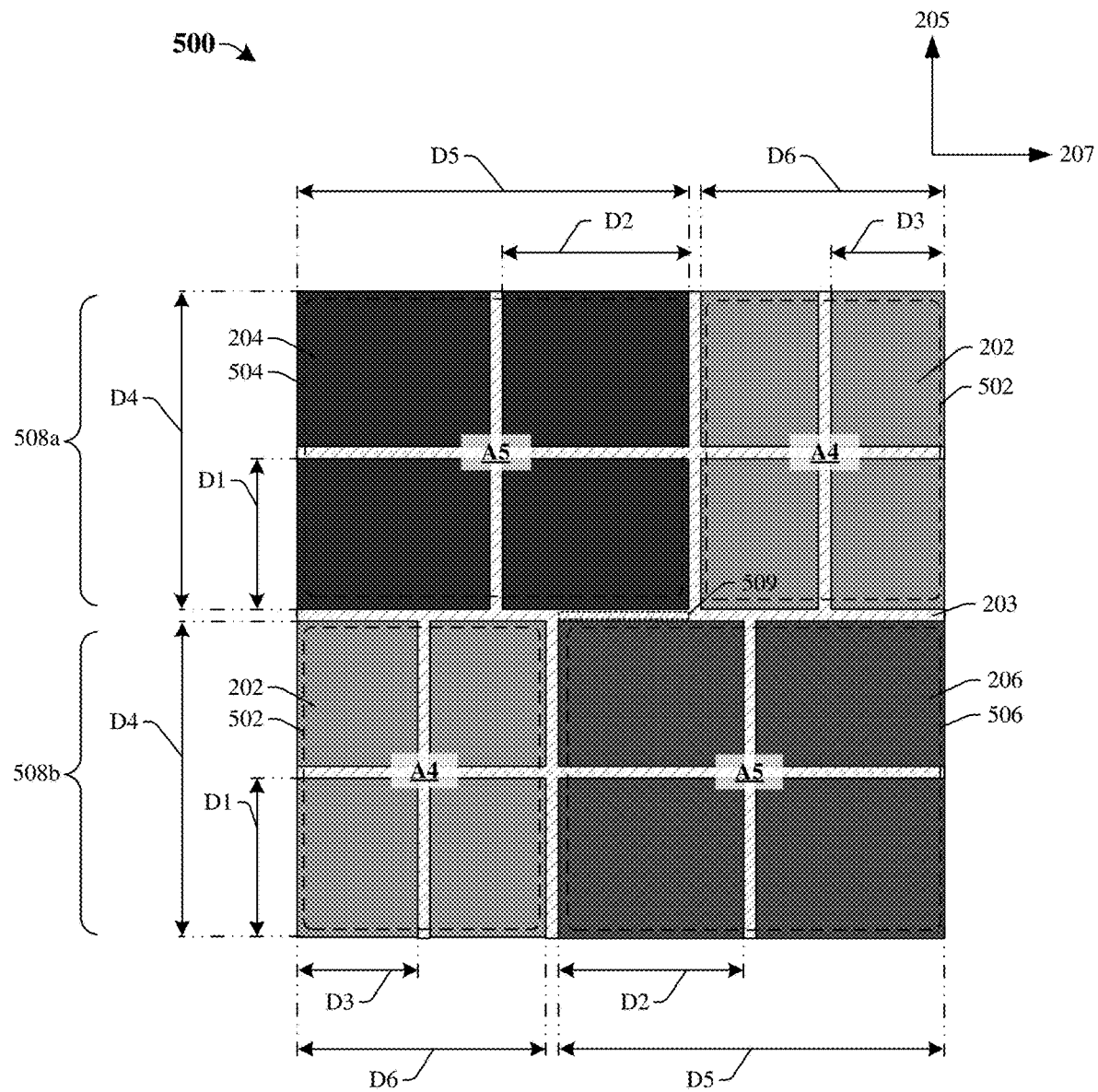

As illustrated by top view 500 of FIG. 5, the plurality of pixel regions is separated into a plurality of pixel groups of different shapes and/or unequal sizes. The pixel groups comprise four pixel regions arranged in a 2×2 pattern. A first row of pixel groups 508a comprises a first pixel group 502 and a second pixel group 504 alternating in a first direction 205, the first pixel group 502 comprising four first pixel regions 202 arranged in a 2×2 pattern, and the second pixel group 504 comprising four second pixel regions 204 arranged in a 2×2 pattern. A second row of pixel groups 508b comprises a first pixel group 502 and a third pixel group 506 alternating in the first direction 205, the first pixel group 502 comprising four first pixel regions 202 arranged in a 2×2 pattern, and the third pixel group 506 comprising four third pixel regions 206 arranged in a 2x2 pattern. In some embodiments, the individual pixel regions of each pixel group may have equal sizes. In alternative embodiments, the plurality of pixel groups may comprise a single pixel region as illustrated in FIG. 2.

The first pixel group 502, the second pixel group 504 and the third pixel group 506 respectively extend in the first direction 205 by a fourth distance D4. The second pixel group 504 and the third pixel group 506 respectively extend in the second direction 207 by a fifth distance D5 different than the fourth distance D4. The first pixel group 502 extends in the second direction 207 by a sixth distance D6 that is different than the fourth distance D4 and less than the fifth distance D5. In some embodiments, the first pixel regions 202 of the first pixel group 502, the second pixel regions 204 of the second pixel group 504, and the third pixel regions 206 of the third pixel group 506 may respectively extend in the first direction 205 by the first distance D1. In some embodiments, the second pixel regions 204 of the second pixel group 504 and the third pixel regions 206 of the third pixel group 506 may respectively extend in the second direction 207 by the second distance D2. In some embodiments, the first pixel regions 202 of the first pixel group 502 may extend in the second direction 207 by the third distance D3.

The first pixel group 502 has a fourth area A4 that may be between three times and five times greater than the first area A1 as described in FIG. 2, and can be four times greater than the first area A1 in some embodiments. The second pixel group 504 and the third pixel group 506 have a fifth area A5 that may be between three times and five times greater than the second area A2 as described in FIG. 2, and can be four times greater than the second area A2 in some embodiments. In alternative embodiments, within the first row of pixel groups 508a, the first pixel group 502 and the second pixel group 504 have equal sizes, and within the second row of pixel groups 508b, the first pixel group 502 and the third pixel group 506 have unequal sizes. In alternative embodiments, within the first row of pixel groups 508a, the first pixel group 502 and the second pixel group 504 have unequal sizes, and within the second row of pixel groups 508b, the first pixel group 502 and the third pixel group 506 have equal sizes. In some embodiments, the first pixel regions 202 of the first pixel group 502 may have the first area A1 as described in FIG. 2. In some embodiments, the second pixel regions 204 of the second pixel group 504 and the third pixel regions 206 of the third pixel group 506 may have the second area A2 as described in FIG. 2.

Individual pixel groups of the plurality of pixel groups are separated from one another by the deep trench isolation structure 203. In some embodiments, the second pixel group 504 shares a common portion 509 of the deep trench isolation structure 203 with the third pixel group 506, and the common portion 509 of the deep trench isolation structure 203 extends in the first direction 205. In some embodiments, the fourth distance D4 may range from approximately 1.5 to approximately 2 times greater than the first distance D1, 1.5 to approximately 2.5 times greater than the first distance D1, or some other suitable value. In some embodiments, the fifth distance D5 may range from approximately 1.5 to approximately 2 times greater than the second distance D2, approximately 1.5 to approximately 2.5 times greater than the second distance D2, or some other suitable value. In some embodiments, the sixth distance D6 may range from approximately 1.5 to approximately 2 times greater than the third distance D3, approximately 1.5 to approximately 2.5 times greater than the third distance D3, or some other suitable value.

Figure 6:
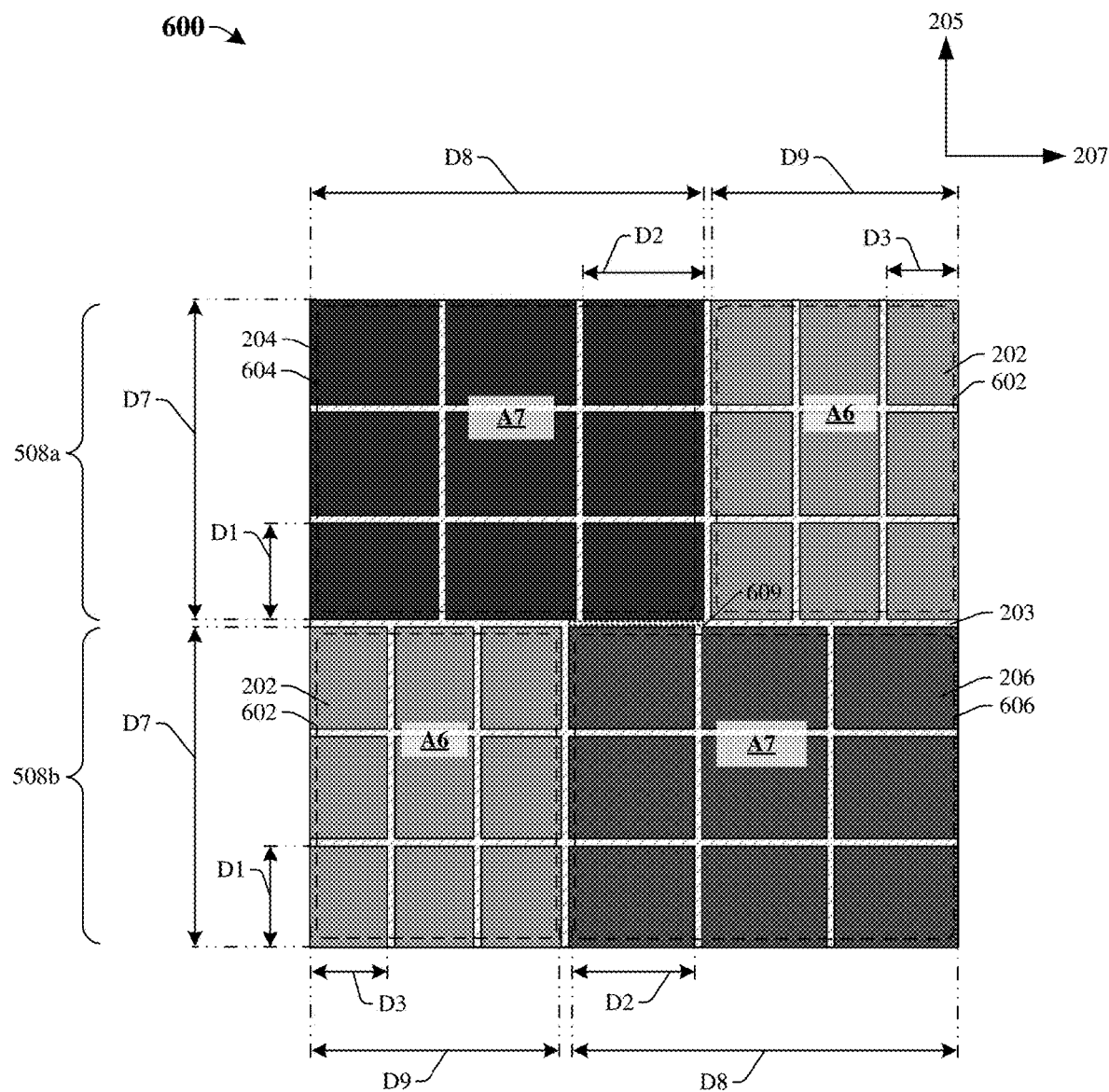

As illustrated by top view 600 of FIG. 6, the plurality of pixel regions is separated into pixel groups of different shapes and/or unequal sizes, the pixel groups comprise nine pixel regions arranged in a 3×3 pattern. A first row of pixel groups 508a comprises a first pixel group 602 and a second pixel group 604 alternating in a first direction 205, the first pixel group 602 comprising nine first pixel regions 202 arranged in a 3×3 pattern, and the second pixel group 604 comprising nine second pixel regions 204 arranged in a 3×3 pattern.

A second row of pixel groups 508b comprises a first pixel group 602 and a third pixel group 606 alternating in the first direction 205, the first pixel group 602 comprising nine first pixel regions 202 arranged in a 3×3 pattern, and the third pixel group 606 comprising nine third pixel regions 206 arranged in a 3×3 pattern. In some embodiments, the individual pixel regions of each pixel group may have equal sizes. The first pixel group 602 has a sixth area A6 that may be between eight times and ten times greater than the first area A1 as described in FIG. 2, and can be nine times greater than the first area A1 in some embodiments. The second pixel group 604 and the third pixel group 606 have a seventh area A7 that may be between eight times and ten times greater than the second area A2 as described in FIG. 2, and can be nine times greater than the second area A2 in some embodiments. In some embodiments, the first pixel regions 202 of the first pixel group 602 may have the first area A1 as described in FIG. 2. In some embodiments, the second pixel regions 204 of the second pixel group 604 and the third pixel regions 206 of the third pixel group 606 may have the second area A2 as described in FIG. 2.

The first pixel group 602, the second pixel group 604 and the third pixel group 606 respectively extend in the first direction 205 by a seventh distance D7. The second pixel group 604 and the third pixel group 606 respectively extend in the second direction 207 by an eighth distance D8 different than the seventh distance D7. The first pixel group 602 extends in the second direction 207 by a ninth distance D9 that is different than the seventh distance D7 and less than the eighth distance D8. In some embodiments, the first pixel regions 202 of the first pixel group 602, the second pixel regions 204 of the second pixel group 604, and the third pixel regions 206 of the third pixel group 606 may respectively extend in the first direction 205 by the first distance D1. In some embodiments, the second pixel regions 204 of the second pixel group 604 and the third pixel regions 206 of the third pixel group 606 may respectively extend in the second direction 207 by the second distance D2. In some embodiments, the first pixel regions 202 of the first pixel group 602 may extend in the second direction 207 by the third distance D3.

Individual pixel groups of the plurality of pixel groups are separated from one another by the deep trench isolation structure 203. In some embodiments, the second pixel group 604 shares a common portion 609 of the deep trench isolation structure 203 with the third pixel group 606, and the common portion 609 of the deep trench isolation structure 203 extends in the first direction 205.

In some embodiments, the seventh distance D7 may range from approximately 2 to approximately 3 times greater than the first distance D1, approximately 2 to approximately 4 times greater than the first distance D1, approximately 2.5 to approximately 3.5 times greater than the first distance D1, or some other suitable value. In some embodiments, the eighth distance D8 may range from approximately 2 to approximately 3 times greater than the second distance D2, approximately 2 to approximately 4 times greater than the second distance D2, approximately 2.5 to approximately 3.5 times greater than the second distance D2, or some other suitable value. In some embodiments, the ninth distance D9 may range from approximately 2 to approximately 3 times greater than the third distance D3, approximately 2 to approximately 4 times greater than the third distance D3, approximately 2.5 to approximately 3.5 times greater than the third distance D3, or some other suitable value.

Figure 7:
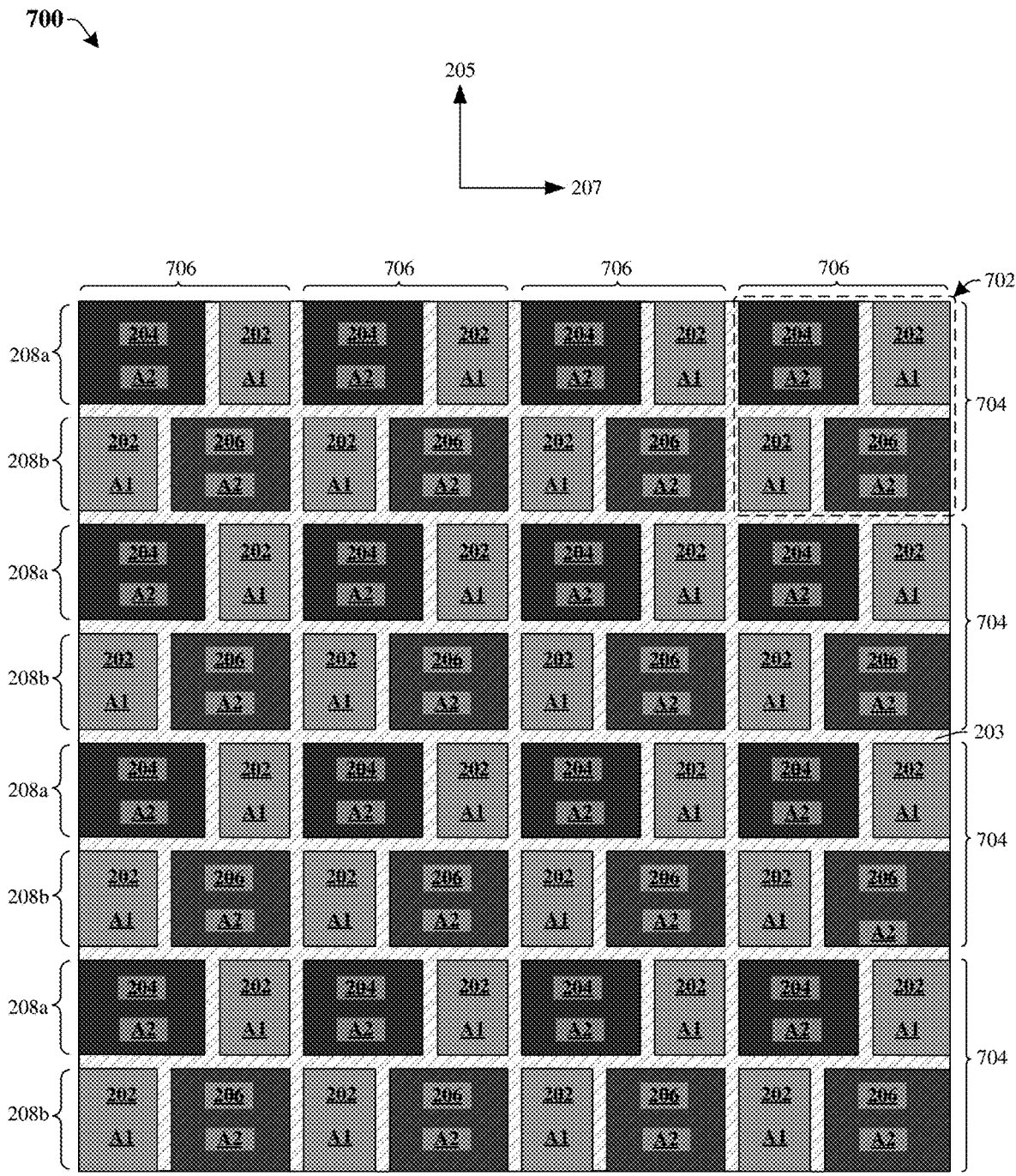
FIG. 7 illustrates a top view of some embodiments of an image sensor comprising a plurality of pixel blocks, respective pixel blocks of the plurality of pixel blocks comprising a plurality of pixel regions of different shapes and/or unequal sizes.

FIG. 7 illustrates a top view 700 of some embodiments of an image sensor comprising a plurality of pixel blocks 702, respective pixel blocks of the plurality of pixel blocks 702 comprising a plurality of pixel regions of different shapes and/or unequal sizes. The plurality of pixel blocks 702 is arranged into a plurality of rows of pixel blocks 704 and a plurality of columns of pixel blocks 706. The plurality of pixel regions are separated from one another by a deep trench isolation structure 203.

Respective pixel blocks of the plurality of pixel blocks 702 comprise a first pixel region 202 having a first area A1, a second pixel region 204 having a second area A2 that is larger than the first area A1. Respective pixel blocks of the plurality of pixel blocks 702 are arranged into a first row of pixel regions 208a and a second row of pixel regions 208b. The first row of pixel regions 208a comprises the first pixel region 202 and the second pixel region 204 alternating in the first direction 205. The second row of pixel regions 208b extends in the first direction 205 and comprises the first pixel region 202 and the third pixel region 206 alternating in the first direction 205. In some embodiments, respective pixel blocks of the plurality of pixel blocks 702 have a square-shaped top profile. In some embodiments, the first pixel region 202 takes up a smaller area across the plurality of pixel regions than the second pixel region 204 and the third pixel region 206 combined, as viewed from above.

In some embodiments, respective pixel blocks of the plurality of pixel blocks 702 may be or otherwise comprise the image sensor of FIG. 2. In alternative embodiments, respective pixel blocks of the plurality of pixel blocks 702 may be or otherwise comprise, for example, the image sensor of FIG. 3 or the image sensor of FIG. 4. In alternative embodiments, respective pixel blocks of the plurality of pixel blocks 702 may be or otherwise comprise, for example, the image sensor of FIG. 5 or the image sensor of FIG. 6, such that respective pixel blocks of the plurality of pixel blocks 702 are arranged into a first row of pixel groups and a second row of pixel groups.

Figure 8:
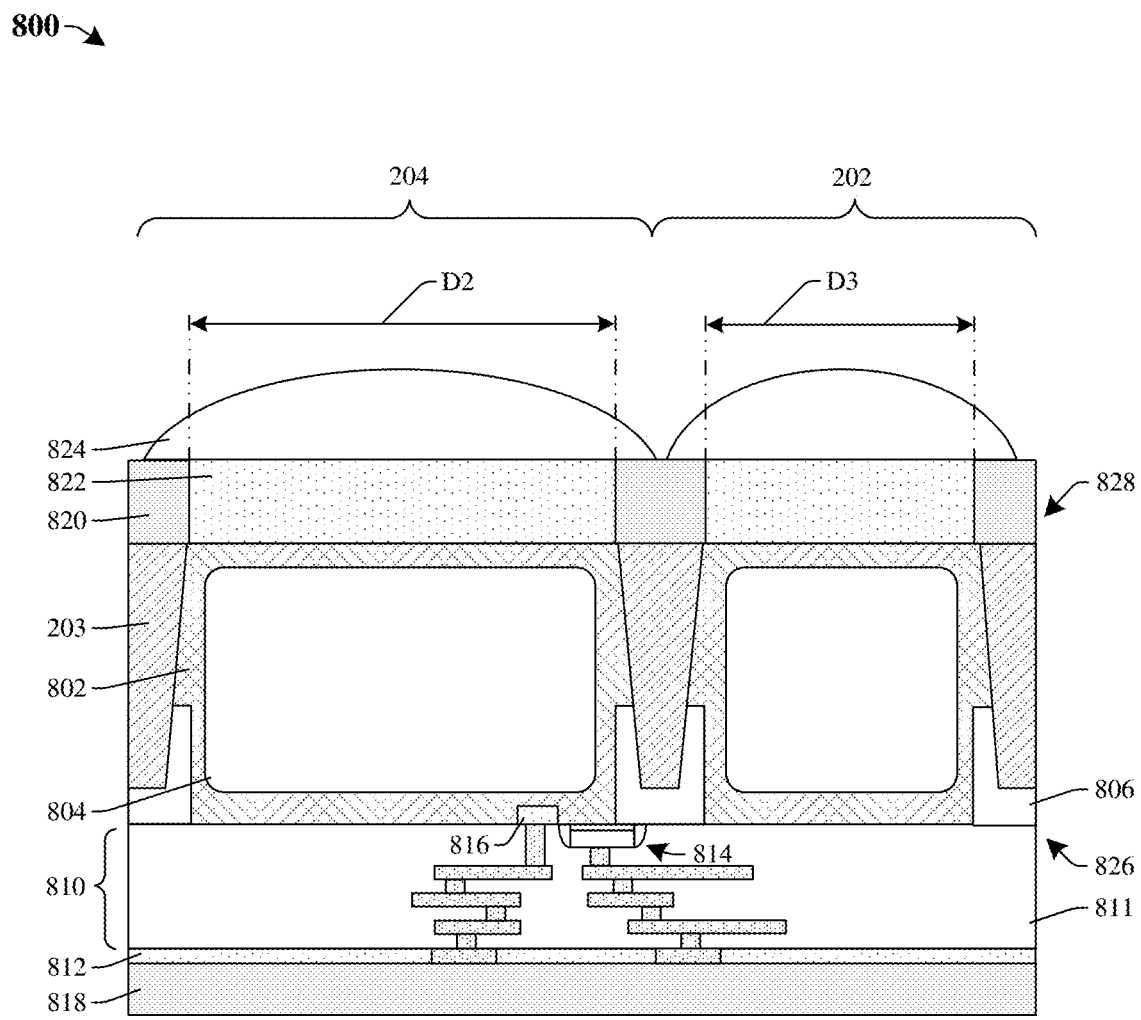
FIG. 8 illustrates a cross-sectional view of some embodiments of an image sensor comprising pixel regions of different shapes and/or unequal sizes.

FIG. 8 illustrates a cross-sectional view 800 of some embodiments of an image sensor comprising pixel regions of different shapes and/or unequal sizes. In some embodiments, the cross-sectional view 800 may be taken along line 210 of FIG. 2. A plurality of photodiodes 804 is disposed within a semiconductor substrate 802. A deep trench isolation structure 203 separates the plurality of photodiodes 804 from one another and defines a plurality of pixel regions (e.g., a first pixel region 202 and a second pixel region 204) corresponding to the plurality of photodiodes 804. The first pixel region 202 is smaller than the second pixel region 204. In some embodiments, the first pixel region 202 and the second pixel region 204 may correspond to the first pixel region 202 and the second pixel region 204 of FIG. 2. In alternative embodiments, the second pixel region 204 may correspond to the third pixel region 206 of FIG. 2. The deep trench isolation structure 203 extends from a backside 828 of the semiconductor substrate 802 to a position within or further through the semiconductor substrate 802. In some embodiments, the deep trench isolation structure 203 extends more than halfway through the semiconductor substrate 802. In some embodiments, the semiconductor substrate 802 may have a first doping type (e.g., p-type). In some embodiments, the plurality of photodiodes 804 may have a second doping type opposite the first doping type (e.g., n-type).

A plurality of doped isolation wells 806 is disposed between and further isolates the first pixel region 202 from the second pixel region 204. The plurality of doped isolation wells 806 extend from a frontside 826 of the semiconductor substrate 802 to a position within the semiconductor substrate 802. The doped isolation wells 806 may be centered with individual trenches of the deep trench isolation structure 203. In some embodiments, the doped isolation wells 806 may have the first doping type. In some embodiments, the doped isolation wells 806 are more heavily doped than the semiconductor substrate 802. In some embodiments, the doped isolation wells 806 extend less than halfway through the semiconductor substrate 802. The deep trench isolation structure 203 may be recessed into the doped isolation wells 806. The doped isolation wells 806 facilitate depletion of the photodiodes 804 during operation since the doped isolation wells 806 provide p-type dopants to the photodiodes 804, such that full well capacity is improved.

A floating diffusion well 816, which acts as a source/drain for a transfer transistor 814, extends from the frontside 826 of the semiconductor substrate 802 to a position within the semiconductor substrate 802. An inter-layer dielectric (ILD) structure 811 is disposed along the frontside 826 of the semiconductor substrate 802. The transfer transistor 814 is disposed within the ILD structure 811 and along the frontside 826 of the semiconductor substrate 802. An interconnect structure 810 is disposed within the ILD structure 811 and electrically coupled to the transfer transistor 814 and the floating diffusion well 816. A redistribution layer 812 comprising a bonding dielectric layer and a plurality of bonding pads is disposed between and electrically couples the interconnect structure 810 to a semiconductor die 818. In some embodiments, the semiconductor die 818 may be a logic die.

A metal grid 820 is disposed along a backside 828 of the semiconductor substrate 802 to minimize cross-talk between adjacent pixel regions. Individual components of the metal grid 820 may be centered with individual trenches of the deep trench isolation structure 203. Individual components of the metal grid 820 are spaced closer together in the first pixel region 202 compared to those of the second pixel region 204. Individual components of the metal grid 820 in the first pixel region 202 are a third distance D3 apart from one another, and individual components of the metal grid 820 in the second pixel region 204 are a second distance D2 greater than the third distance D3 apart from one another. In some embodiments, the second distance D2 may range from approximately 1% to approximately 50%, from approximately 5% to approximately 20%, from approximately 10% to approximately 30%, or some other suitable value larger than the third distance D3. In some embodiments, the metal grid 820, the doped isolation wells 806, and the deep trench isolation structure 203 separate the plurality of photodiodes 804 from one another and define the plurality of pixel regions (e.g., the first pixel region 202 and the second pixel region 204) corresponding to the plurality of photodiodes 804.

An array of color filters 822 is disposed along the backside 828 of the semiconductor substrate 802 and between individual components of the metal grid 820. Each color filter of the array of color filters 822 directly overlies a corresponding photodiode of the plurality of photodiodes 804. In some embodiments, a color filter of the array of color filters 822 in the first pixel region 202 is sensitive to a first region of the light spectrum. In some embodiments, a color filter of the array of color filters 822 in the second pixel region 204 is sensitive to a second region of the light spectrum. In some embodiments, the first region of the light spectrum is a green region and the second region of the light spectrum is a blue region. In alternative embodiments, the second region of the light spectrum is a red region. A plurality of micro-lenses 824 directly overlies a corresponding color filter of the array of color filters 822. In some embodiments, the micro-lens of the plurality of micro-lenses 824 of the first pixel region 202 is smaller than the micro-lens of the plurality of micro-lenses 824 of the second pixel region 204. Notably, though the plurality of micro-lenses 824 is shown as fixing onto the image sensor in FIG. 8, it is appreciated that the image sensor may not include micro-lenses, and the micro-lenses may be attached to the image sensor later in a separate manufacture activity.

During operation of the image sensor, incident radiation (e.g., photons) is focused by the plurality of micro-lenses 824 to a corresponding pixel region. When incident radiation of sufficient energy strikes the photodiodes 804, it generates an electron-hole pair that produces a photocurrent. Since the first region of the light spectrum corresponds to a wavelength with a greater quantum efficiency than those corresponding to the second and third regions of the light spectrum, the second distance D2 is larger than the third distance D3 to cause more incident photons to deflect off of the metal grid 820 in the first pixel region 202 compared to the second pixel region 204, hence decreasing a quantum efficiency of the first pixel region 202 and increasing a quantum efficiency of the second pixel region 204. A better device performance can therefore be achieved compared to image sensors comprising pixels of equal sizes by distributing quantum efficiency more evenly across pixels.

In some embodiments, the semiconductor substrate 802 may comprise any type of semiconductor body (e.g., silicon/germanium/CMOS bulk, SiGe, SOI, etc.) such as a semiconductor wafer or one or more die on a wafer, as well as any other type of semiconductor and/or epitaxial layers formed thereon and/or otherwise associated therewith. In some embodiments, the deep trench isolation structure 203 and the bonding dielectric layer of the redistribution layer 812 may be or comprise, for example, silicon dioxide, silicon nitride, some other suitable dielectric material(s), or a combination of the foregoing. In some embodiments, the interconnect structure 810 and the bonding pads of the redistribution layer 812 may be or comprise, for example, tungsten, copper, gold, aluminum copper, titanium nitride, or some other suitable conductive material(s). In some embodiments, the ILD structure 811 may be or comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the metal grid 820 may be or comprise, for example, tungsten, copper, gold, aluminum, or some other suitable material(s).

With reference to FIGS. 9-19, a series of cross sections 900-1900 illustrates some embodiments of a method for forming an image sensor comprising pixel regions of different shapes and/or unequal sizes. The image sensor may, for example, correspond to the image sensor of FIG. 8. Although FIGS. 9-19 are described in relation to a method, it will be appreciated that the structures disclosed in FIGS.

9-19 are not limited to such a method, but instead may stand alone as structures independent of the method.

Figure 9:
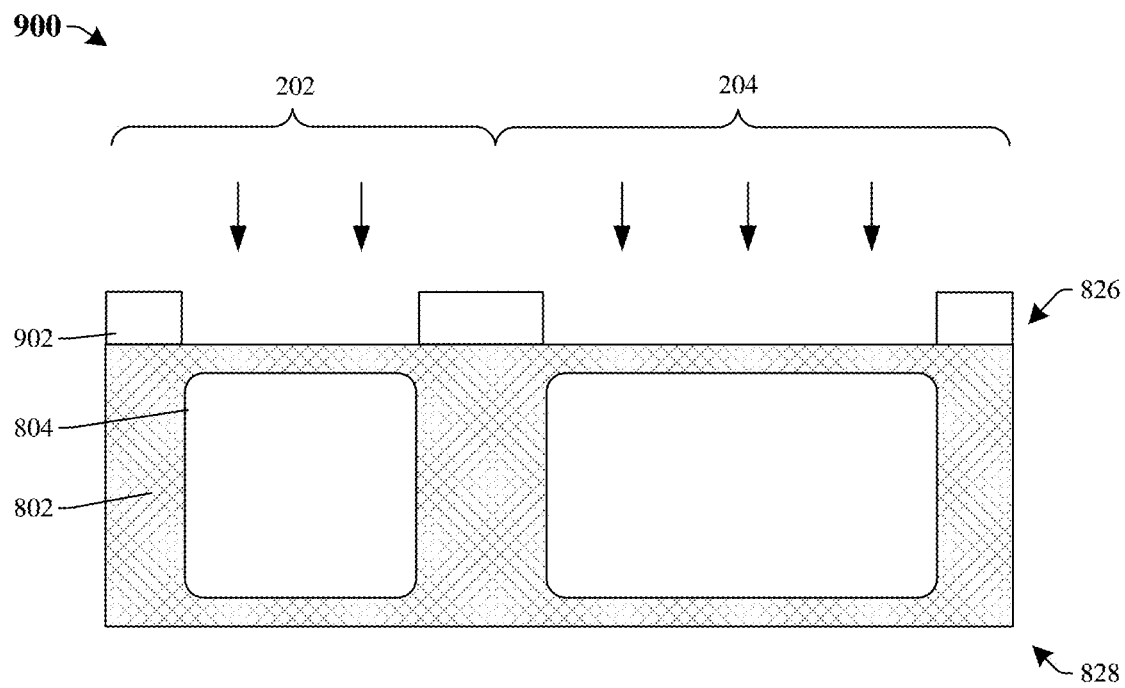
FIGS. 9-19 illustrate a series of cross sections of some embodiments of a method for forming an image sensor comprising pixel regions of different shapes and/or unequal sizes.

As illustrated by the cross-sectional view 900 of FIG. 9, a plurality of photodiodes 804 is formed in a semiconductor substrate 802. The photodiodes 804 may be formed by, for example, a doping process. In some embodiments, the doping process may comprise forming a masking structure 902 over a frontside 826 of the semiconductor substrate 802 and implanting a dopant of a first doping type into the semiconductor substrate 802 (e.g., n-type doping by arsenic, phosphorous, or some other suitable n-type dopant). In some embodiments, the masking structure 902 is then removed. A photodiode of the plurality of photodiodes 804 in a first pixel region 202 has a smaller cross-sectional area than a photodiode of the plurality of photodiodes 804 in a second pixel region 204, as viewed from above.

Figure 10:
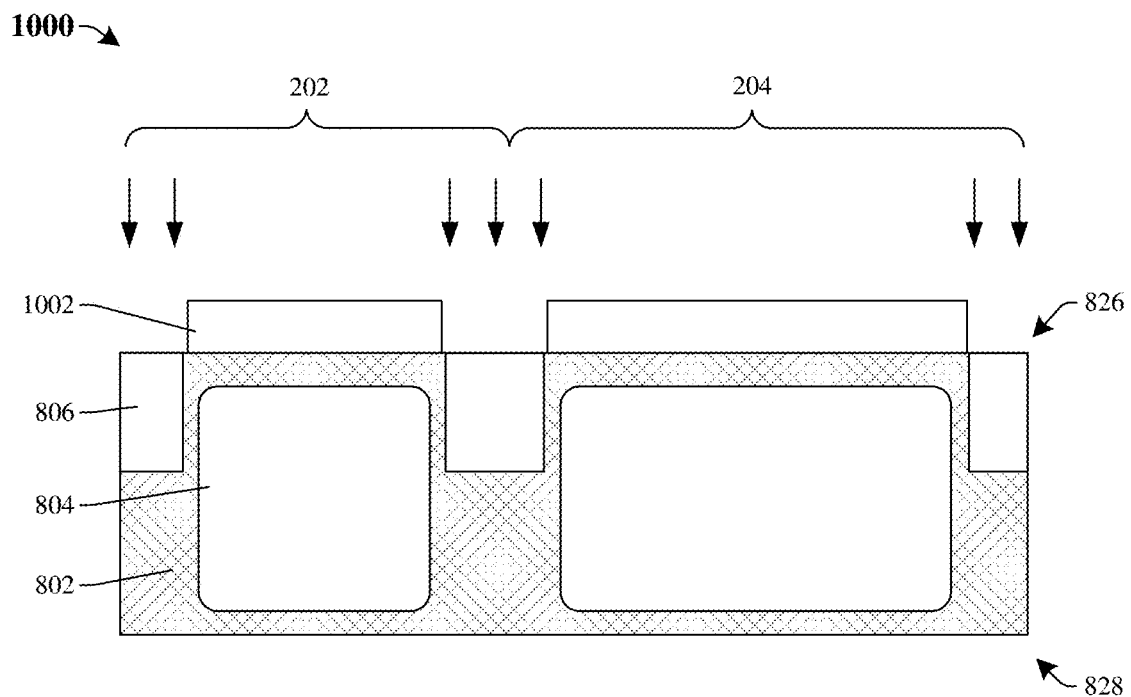

As illustrated by the cross-sectional view 1000 of FIG. 10, a plurality of doped isolation wells 806 is formed in the frontside 826 of the semiconductor substrate 802 between adjacent photodiodes of the plurality of photodiodes 804. The doped isolation wells 806 may be formed by, for example, a doping process. In some embodiments, the doping process may comprise forming a masking structure 1002 over a frontside 826 of the semiconductor substrate 802 and implanting a dopant of a second doping type opposite the first doping type (e.g., p-type doping by boron or some other suitable p-type dopant). In some embodiments, the masking structure 1002 is then removed.

Figure 11:
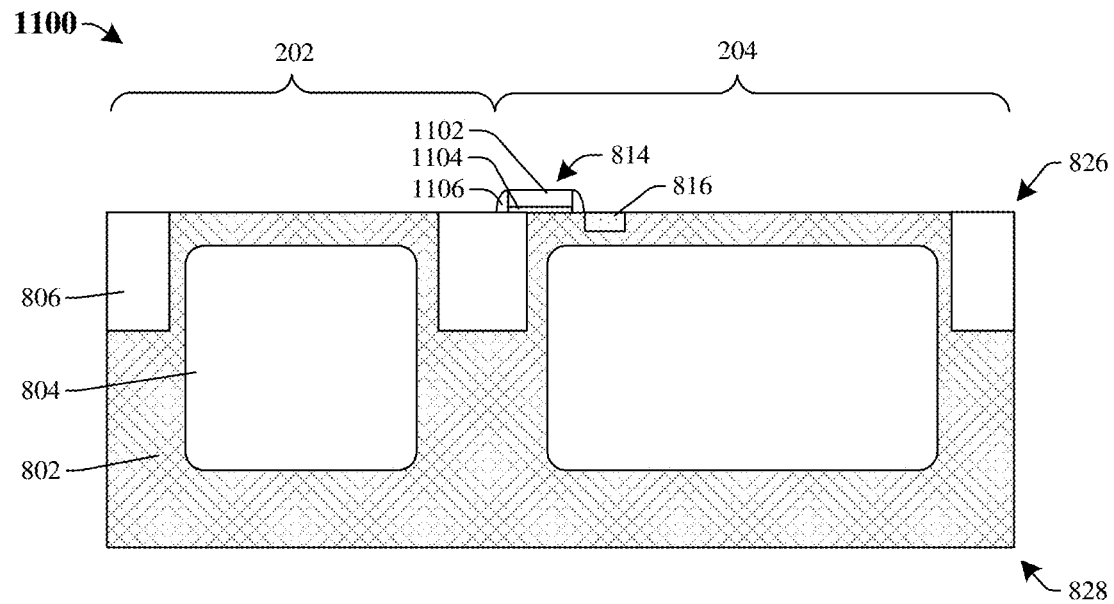

As illustrated by the cross-sectional view 1100 of FIG. 11, a transfer transistor 814 is formed over the frontside 826 of the semiconductor substrate 802. The transfer transistor 814 may be formed by depositing a gate dielectric layer and a gate electrode layer over the semiconductor substrate 802. The gate dielectric layer and the gate electrode layer are subsequently patterned to form a gate dielectric 1102 and a gate electrode 1104. In some embodiments, a sidewall spacer 1106 is formed along sidewalls of the gate dielectric 1102 and the gate electrode 1104. In some embodiments, an implantation process is performed within the frontside 826 of the semiconductor substrate 802 to form a floating diffusion well 816 along one side of the transfer transistor 814.

Figure 12:
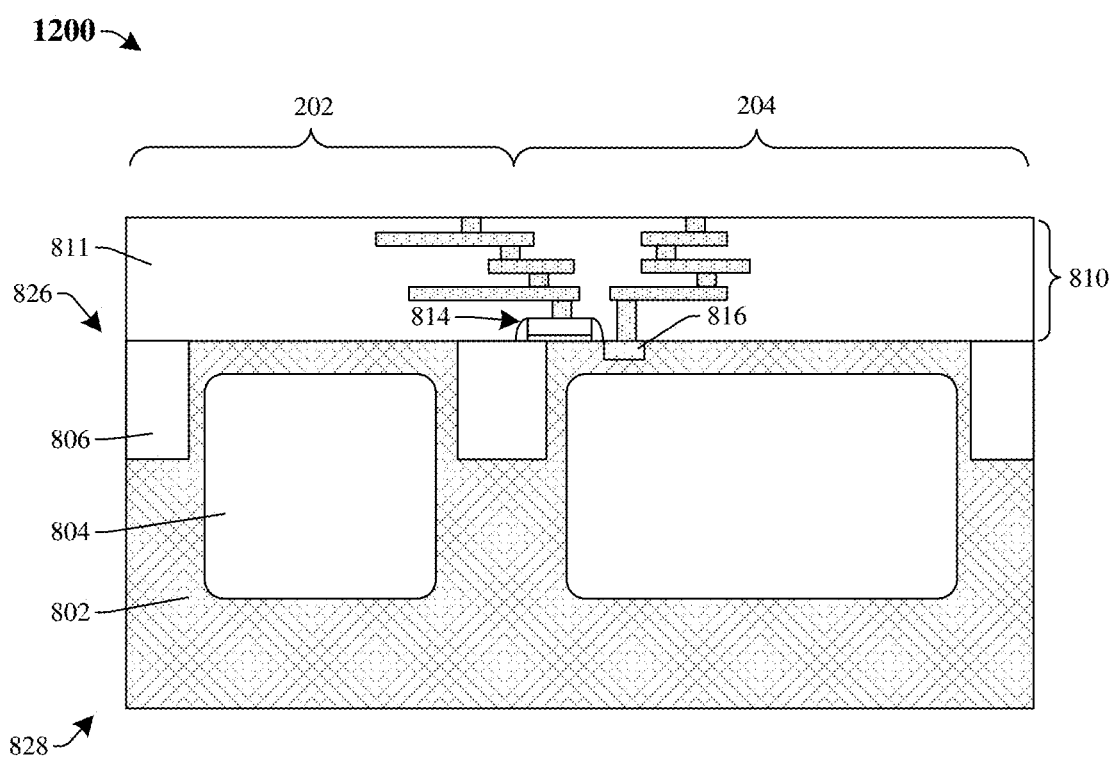

As illustrated by the cross-sectional view 1200 of FIG. 12, an ILD structure 811 is formed over the transfer transistor 814 and the frontside 826 of the semiconductor substrate 802. The ILD structure 811 is subsequently etched to form via holes and/or metal trenches. An interconnect structure 810 is then formed within the via holes and/or metal trenches. In some embodiments, the ILD structure 811 may be deposited by a deposition process such as physical vapor deposition (PVD), chemical vapor deposition (CVD), or some other suitable deposition process. The interconnect structure 810 may be formed using a deposition process (e.g., PVD, CVD, or the like) and/or a plating process (e.g., electroplating, electro-less plating, or the like).

Figure 13:
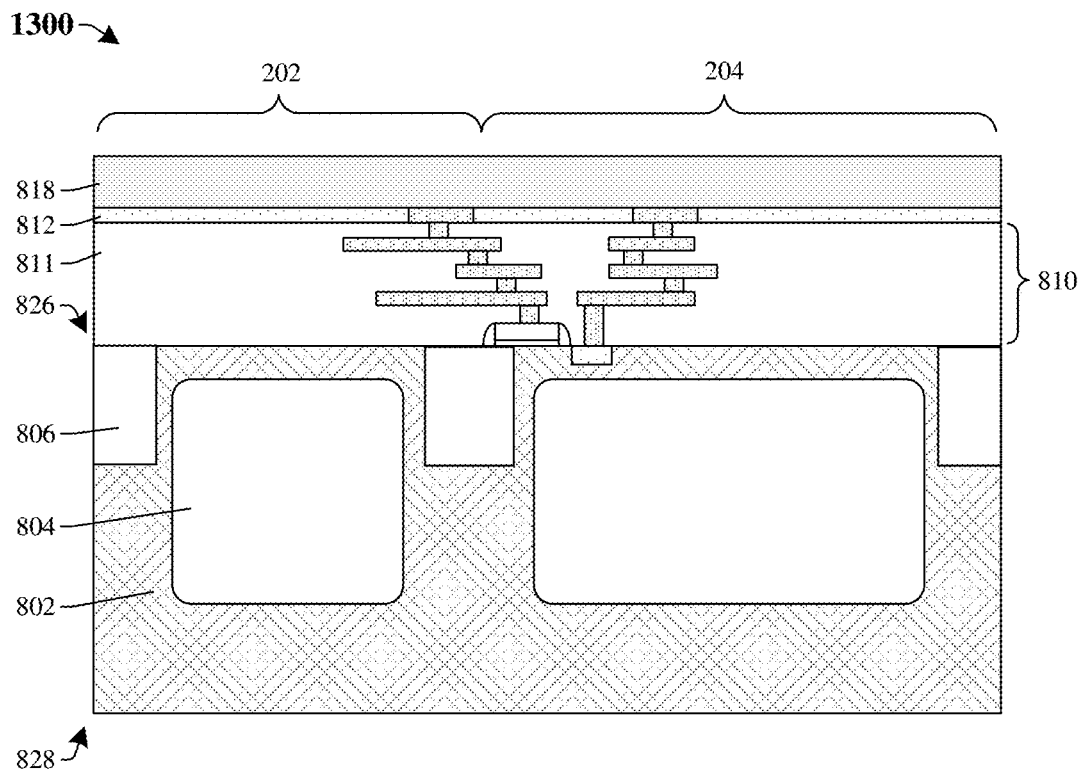

As illustrated by the cross-sectional view 1300 of FIG. 13, a redistribution layer 812 is formed over the ILD structure 811. The redistribution layer 812 may be formed using a deposition process (e.g., PVD, CVD, or the like) and/or a plating process (e.g., electroplating, electro-less plating, or the like). A semiconductor die 818 is then bonded to the redistribution layer 812. An annealing process may follow the bonding process, and may be performed at a temperature range between about 250° C. to about 450° F. for a time in a range of about 0.5 hour to about 4 hours, for example.

Figure 14:
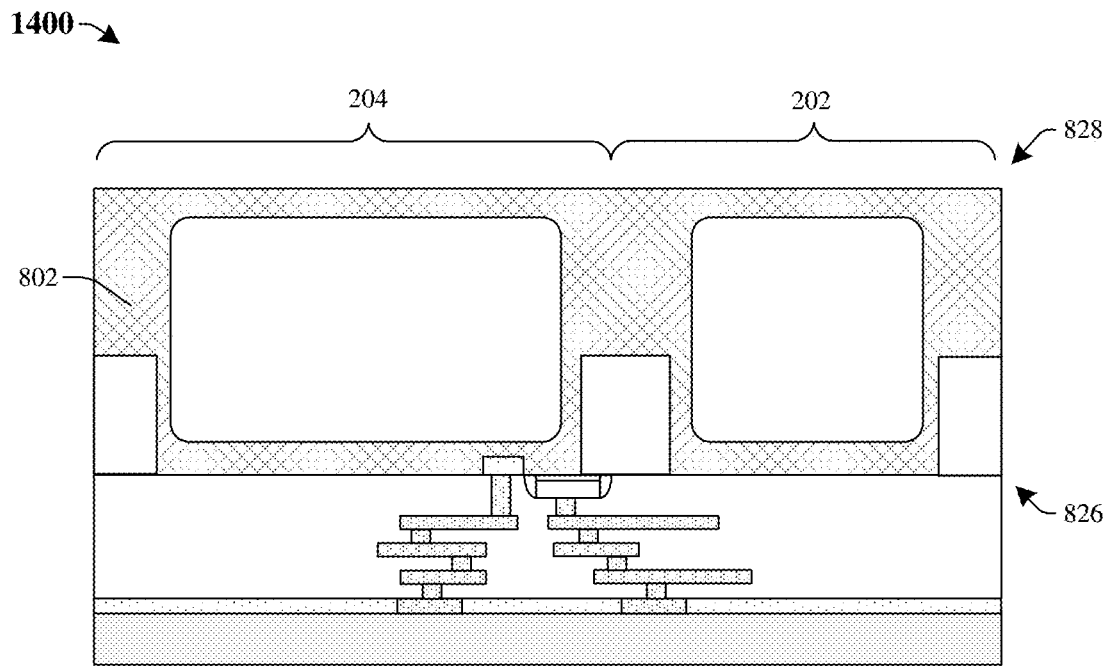

As illustrated by the cross-sectional view 1400 of FIG. 14, the image sensor is flipped and a backside 828 of the semiconductor substrate 802 is thinned. The thinning process may allow for radiation to pass through the backside 828 of the semiconductor substrate 802 to the photodiodes 804. The semiconductor substrate 802 may be thinned by etching the backside 828 of the semiconductor substrate 802. Alternatively, the semiconductor substrate 802 may be thinned by mechanical grinding the backside 828 of the semiconductor substrate 802 or by performing a chemical mechanical planarization (CMP) on the backside 828 of the semiconductor substrate 802.

Figure 15:
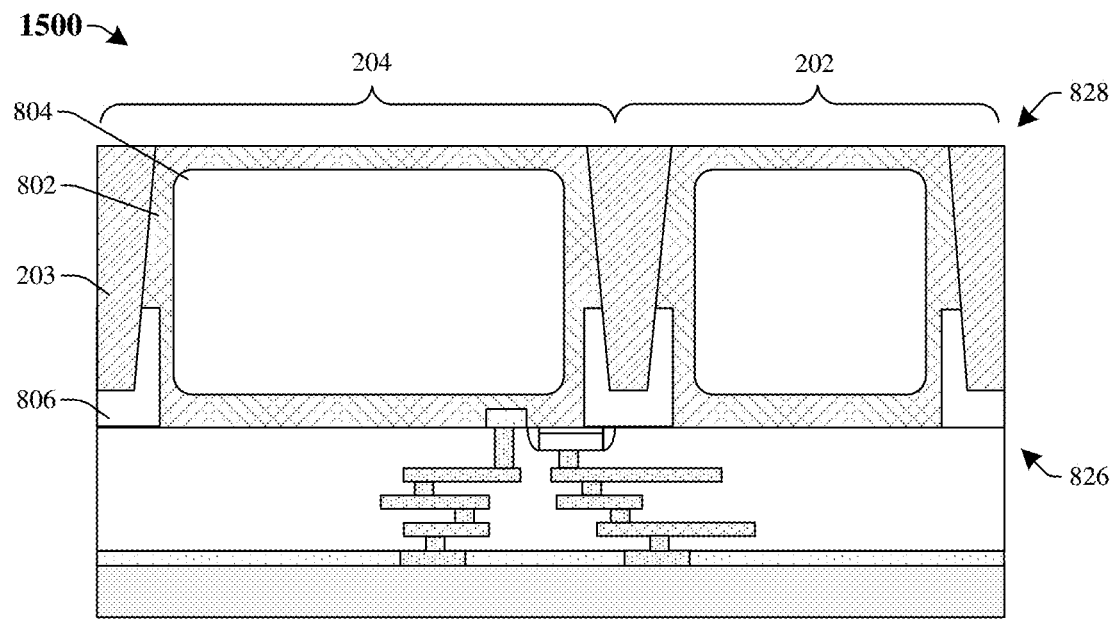

As illustrated by the cross-sectional view 1500 of FIG. 15, a deep trench isolation structure 203 is formed into the backside 828 of the semiconductor substrate 802 to separate adjacent photodiodes of the plurality of photodiodes 804. The deep trench isolation structure 203 may be formed by etching a plurality of deep trenches into the backside 828 of the semiconductor substrate 802. An isolation filler material is then deposited by, for example, PVD, CVD, or some other suitable deposition process over the semiconductor substrate 802 and into the plurality of deep trenches. In some embodiments, lateral portions of the isolation filler material may be removed or thinned such that a top surface of the deep trench isolation structure 203 is approximately level with a backside 828 of the semiconductor substrate 802. Individual trenches of the deep trench isolation structure 203 are spaced further apart in the second pixel region 204 than the first pixel region 202. In some embodiments, the deep trench isolation structure 203 is recessed into the plurality of doped isolation wells 806.

Figure 16:
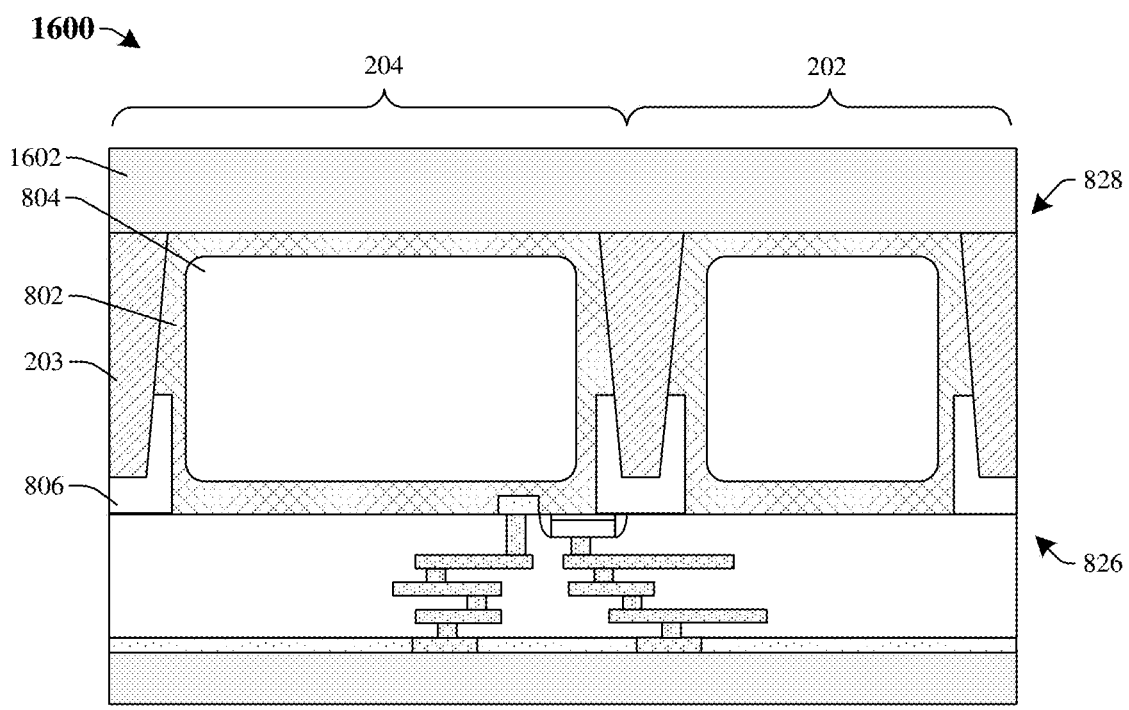

As illustrated by the cross-sectional view 1600 of FIG. 16, a metal layer 1602 is formed over the backside of the semiconductor substrate 802. The metal layer 1602 may be formed using a deposition process (e.g., PVD, CVD, or the like) and/or a plating process (e.g., electroplating, electro-less plating, or the like).

Figure 17:
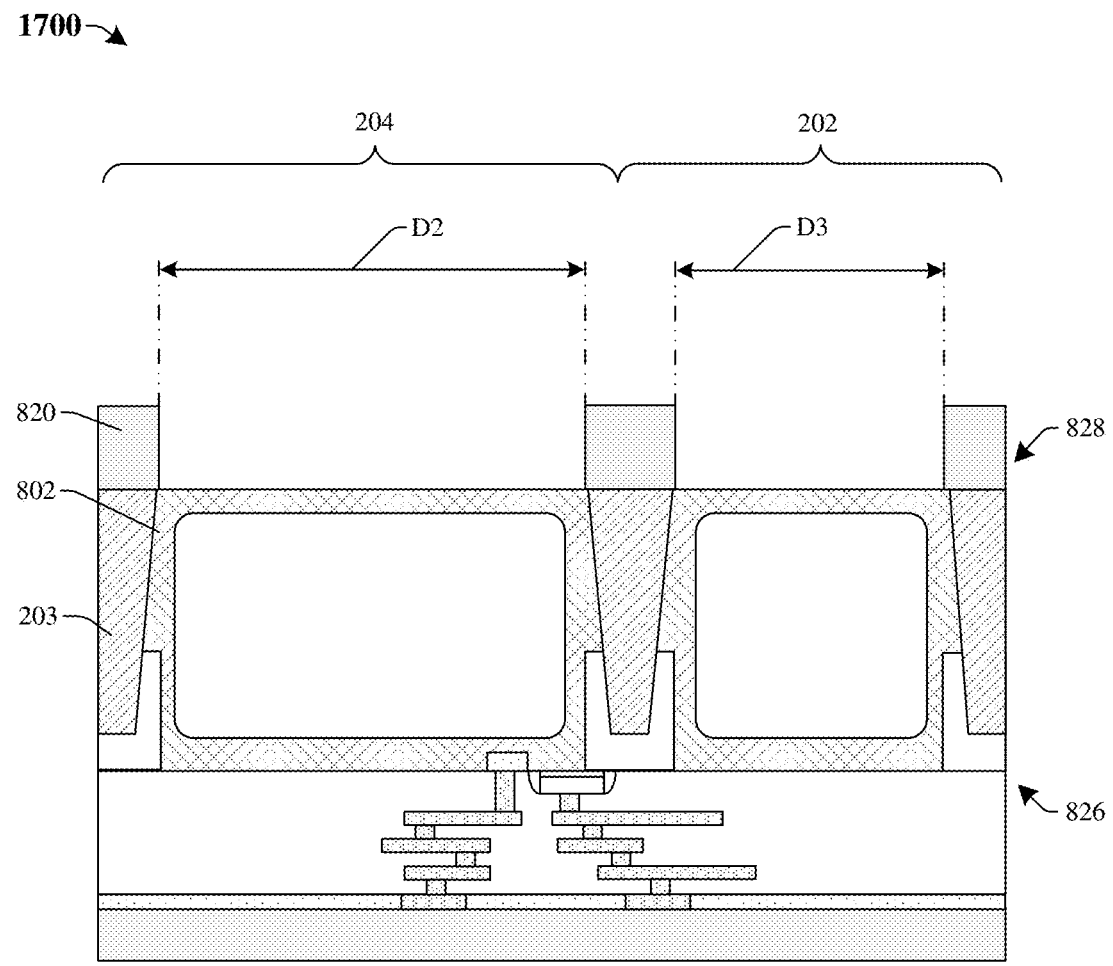

As illustrated by the cross-sectional view 1700 of FIG. 17, the metal layer 1602 is selectively patterned to form a metal grid 820 overlying the semiconductor substrate 802. In some embodiments, individual components of the metal grid 820 directly overlie individual trenches of the deep trench isolation structure 203. Individual components of the metal grid 820 in the first pixel region 202 are a third distance D3 apart from one another, and individual components of the metal grid 820 in the second pixel region 204 are a second distance D2 greater than the third distance D3 apart from one another.

Figure 18:
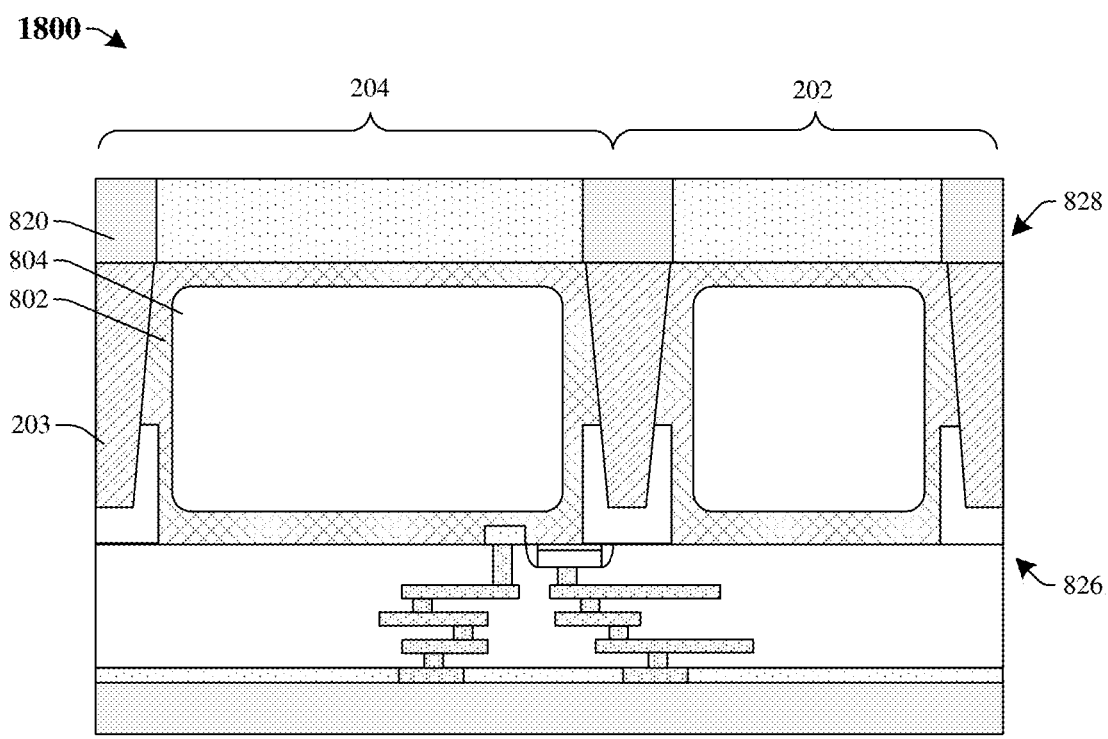

As illustrated by the cross-sectional view 1800 of FIG. 18, an array of color filters 822 is formed over the backside 828 of the semiconductor substrate 802 and between individual components of the metal grid 820. In some embodiments, the array of color filters 822 may be formed with upper surfaces aligned with upper surfaces of the metal grid 820. In some embodiments, a color filter of the array of color filters 822 in the first pixel region 202 is sensitive to a first region of the light spectrum. In some embodiments, a color filter of the array of color filters 822 in the second pixel region 204 is sensitive to a second region of the light spectrum. In some embodiments, the first region of the light spectrum is a green region and the second region of the light spectrum is a blue region. In alternative embodiments, the second region of the light spectrum is a red region. The process for forming the array of color filters 822 may include, for each of the regions of the light spectrum the corresponding color filter is sensitive to, forming a color filter layer and patterning the color filter layer. The color filter layer may be planarized subsequent to formation. The patterning may be performed by forming a photoresist layer with a pattern over the color filter layer, applying an etchant to the color filter layer according to the pattern of the photoresist layer, and removing the pattern photoresist layer.

Since the first region of the light spectrum corresponds to a wavelength with a greater quantum efficiency than those corresponding to the second and third regions of the light spectrum, the color filter of the array of color filters 822 is smaller in the first pixel region 202 compared to that of the second pixel region 204, hence decreasing a quantum efficiency of the first pixel region 202 and increasing a quantum efficiency of the second pixel region 204. A better device performance can therefore be achieved compared to image sensors comprising pixels of equal sizes by distributing quantum efficiency more evenly across pixels.

Figure 19:
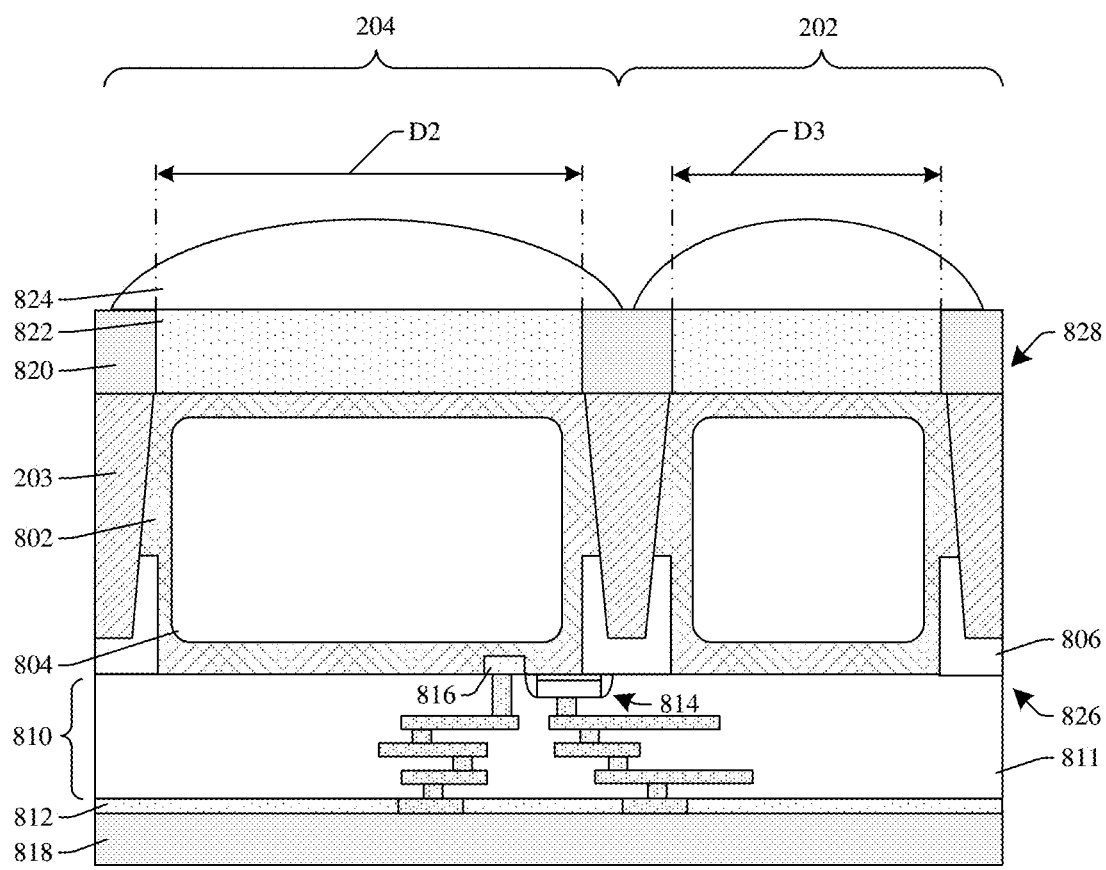

As illustrated by the cross-sectional view 1900 of FIG. 19, a plurality of micro-lenses 824 is formed over the array of color filters 822. In some embodiments, the plurality of micro-lenses 824 may be formed by depositing a micro-lens material above the array of color filters (e.g., by a spin-on method or a deposition process). A micro-lens template having a curved upper surface is patterned above the micro-lens material. In some embodiments, the micro-lens template may comprise a photoresist material exposed using a distributing exposing light dose (e.g., for a negative photoresist, more light is exposed at a bottom of the curvature and less light is exposed at a top of the curvature), developed and baked to form a rounding shape. The plurality of micro-lenses 824 are then formed by selectively etching the micro-lens material according to the micro-lens template. The micro-lens of the plurality of micro-lenses 824 of the first pixel region 202 is formed to be smaller than the micro-lens of the plurality of micro-lenses 824 of the second pixel region 204.

Figure 20:
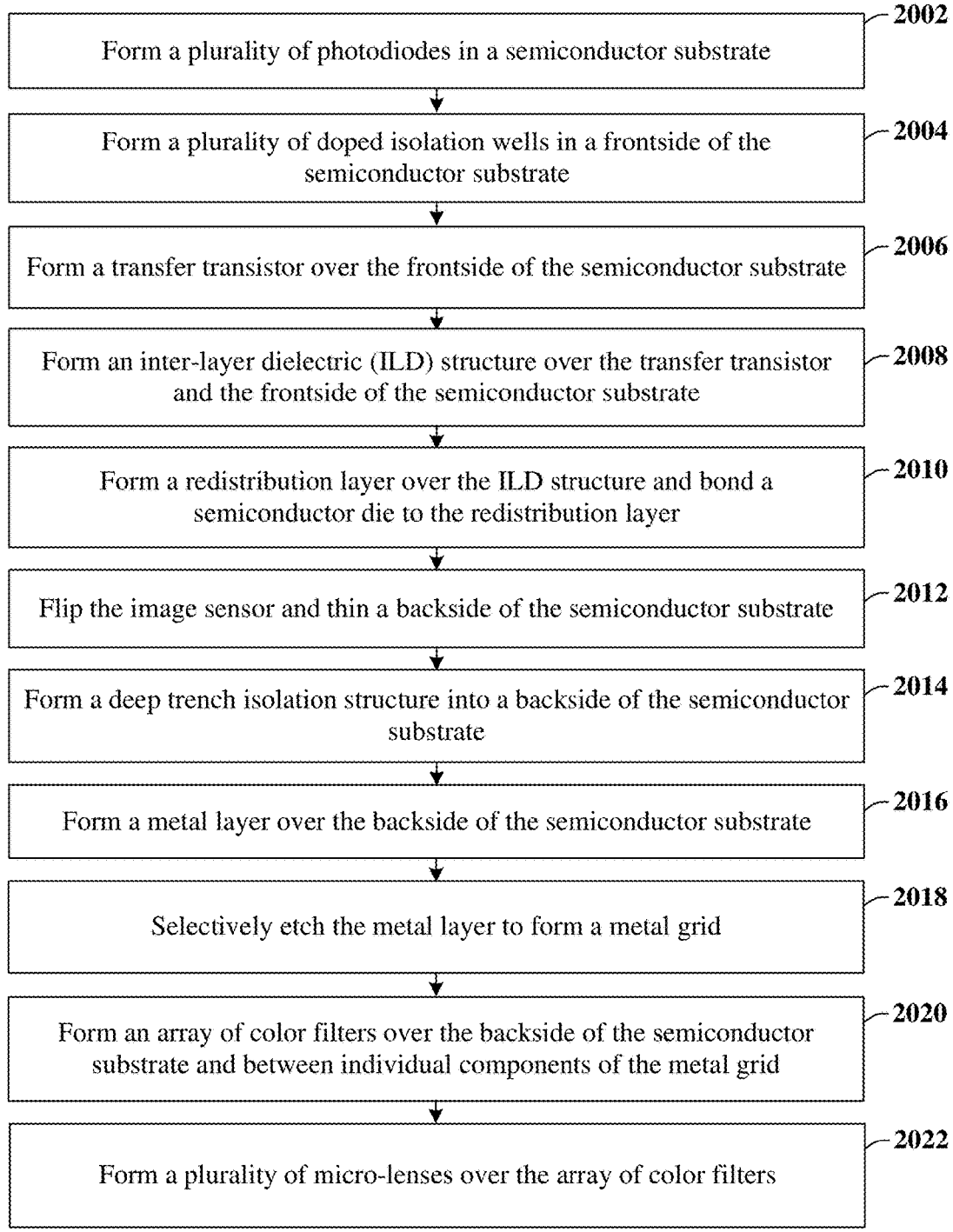
FIG. 20 illustrates a flow diagram of some embodiments of a method for forming an image sensor comprising pixel regions of different shapes and/or unequal sizes.

With respect to FIG. 20, a flowchart 2000 of some embodiments of a method for forming an image sensor comprising pixel regions of different shapes and/or unequal sizes. The image sensor may, for example, correspond to the image sensor of FIG. 8.

While flowchart 2000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2002, a plurality of photodiodes is formed in a semiconductor substrate. See, for example, FIG. 9.

At act 2004, a plurality of doped isolation wells is formed in a frontside of the semiconductor substrate. See, for example, FIG. 10.

At act 2006, a transfer transistor is formed over the frontside of the semiconductor substrate. See, for example, FIG. 11.

At act 2008, an inter-layer dielectric (ILD) structure is formed over the transfer transistor and the frontside of the semiconductor substrate. See, for example, FIG. 12.

At act 2010, a redistribution layer is formed over the ILD structure and a semiconductor die is bonded to the redistribution layer. See, for example, FIG. 13.

At act 2012, the image sensor is flipped and a backside of the semiconductor substrate is thinned. See, for example, FIG. 14.

At act 2014, a deep trench isolation structure is formed into a backside of the semiconductor substrate. See, for example, FIG. 15.

At act 2016, a metal layer is formed over the backside of the semiconductor substrate. See, for example, FIG. 16.

At act 2018, the metal layer is selectively etched to form a metal grid. See, for example, FIG. 17.

At act 2020, an array of color filters is formed over the backside of the semiconductor substrate and between individual components of the metal grid. See, for example, FIG. 18.

At act 2022, a plurality of micro-lenses is formed over the array of color filters. See, for example, FIG. 19.

Accordingly, in some embodiments, the present disclosure relates to an image sensor, including a semiconductor substrate, a plurality of photodiodes disposed within the semiconductor substrate, and a deep trench isolation structure separating the plurality of photodiodes from one another and defining a plurality of pixel regions corresponding to the plurality of photodiodes. The plurality of pixel regions includes a first pixel region sensitive to a first region of a light spectrum, a second pixel region sensitive to a second region of the light spectrum, and a third pixel region sensitive to a third region of the light spectrum. The first pixel region is smaller than the second pixel region or the third pixel region.

In other embodiments, the present disclosure relates to a method for forming an image sensor, including forming a plurality of photodiodes in a semiconductor substrate, forming a deep trench isolation structure into a backside of the semiconductor substrate separating the plurality of photodiodes into a plurality of pixel regions correspondingly, and forming an array of color filters over the semiconductor substrate, such that each color filter directly overlies a corresponding photodiode. The plurality of pixel regions includes a first pixel region sensitive to a first region of a light spectrum, a second pixel region sensitive to a second region of the light spectrum, and a third pixel region sensitive to a third region of the light spectrum. A color filter of the array of color filters in the first pixel region has an area that is smaller than a color filter of the array of color filters in the second pixel region or the third pixel region, as viewed from above.

In yet other embodiments, the present disclosure relates to image sensor, including a semiconductor substrate, a plurality of photodiodes disposed within the semiconductor substrate, a deep trench isolation structure separating the plurality of photodiodes, and a metal grid overlying the semiconductor substrate and directly overlying the deep trench isolation structure. The metal grid and the deep trench isolation structure define a plurality of pixel regions corresponding to the plurality of photodiodes. The plurality of pixel regions comprises a first pixel region sensitive to a first region of a light spectrum, a second pixel region sensitive to a second region of the light spectrum, and a third pixel region sensitive to a third region of the light spectrum. A ratio of an area of the metal grid as viewed from above to a total area of the pixel region as viewed from above is greater for the first pixel region than for the second pixel region or the third pixel region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
a semiconductor substrate;
a plurality of photodiodes disposed within the semiconductor substrate; and
a deep trench isolation (DTI) structure separating the plurality of photodiodes from one another and defining a plurality of pixel regions corresponding to the plurality of photodiodes, wherein the plurality of pixel regions comprises a first pixel region sensitive to a first region of a light spectrum, a second pixel region sensitive to a second region of the light spectrum, and a third pixel region sensitive to a third region of the light spectrum, and wherein the first pixel region has a first width that is smaller than a second width of the second pixel region and a third width of the third pixel region when measured in a first direction, and the first pixel region has a first height equal to a second height of the second pixel region and equal to a third height of the third pixel region when measured in a second direction perpendicular to the first direction when viewed from above; and
wherein the DTI structure forms a parallelogram that laterally surrounds the first pixel region, the second pixel region, and the third pixel region when viewed from above, wherein the DTI structure includes a first linear segment that extends in parallel with upper and lower sides of the parallelogram and that bisects left and right sides of the parallelogram, and wherein the DTI structure includes second and third linear segments that extend in parallel with the left and right sides of the parallelogram and are offset from one another, the second linear segment lying on a line that intersects an upper edge of the second pixel region and the third linear segment lying on a line that intersects a lower edge of the third pixel region.

2. The image sensor of claim 1, wherein the first region of the light spectrum is a green region, and wherein the second region of the light spectrum and the third region of the light spectrum are a blue region and a red region, respectively.

3. The image sensor of claim 1, wherein the first pixel region has a first area that is at least 1% smaller than each of a second area of the second pixel region and a third area of the third pixel region, as viewed from above.

4. The image sensor of claim 3, wherein a first ratio of the first area to the second area is within a range of 90% to 110% of a second ratio of a first quantum efficiency for the first pixel region to a second quantum efficiency for the second pixel region.

5. The image sensor of claim 1, wherein the first pixel region has an area that is less than 50% smaller than that of the second pixel region or that of the third pixel region, as viewed from above.

6. The image sensor of claim 1, wherein the first direction and the second direction define a plane that is parallel to a top surface of the semiconductor substrate.

7. A method for forming an image sensor, comprising:
forming a plurality of photodiodes in a semiconductor substrate;
forming a deep trench isolation structure into the semiconductor substrate separating the plurality of photodiodes into a plurality of pixel regions, the deep trench isolation structure defining a closed loop as viewed from above; and
forming an array of color filters over the semiconductor substrate, such that each color filter directly overlies a corresponding photodiode,
wherein the closed loop laterally surrounds a first pixel region sensitive to a first region of a light spectrum, a second pixel region sensitive to a second region of the light spectrum, and a third pixel region sensitive to a third region of the light spectrum, and wherein a color filter of the array of color filters in the first pixel region has an area that is smaller than a color filter of the array of color filters in the second pixel region or the third pixel region, as viewed from above;
wherein the deep trench isolation structure has a first linear segment extending in a first direction and a second linear segment extending in the first direction when viewed from above, wherein the first pixel region is disposed between the first linear segment and a first edge of the closed loop and the second pixel region is disposed between the second linear segment and a second edge of the closed loop opposite the first edge when viewed from above, and wherein the deep trench isolation structure has a third linear segment in a second direction perpendicular to the first direction, the third linear segment bisecting the first and second edges of the closed loop and separating the first pixel region and second pixel region from the third pixel region when viewed from above, the first and second linear segments extending perpendicularly from opposite sides of the third linear segment, wherein at least one of the first linear segment or second linear segment lies along a line that intersects the second pixel region or the third pixel region.

8. The method of claim 7, wherein individual trenches of the deep trench isolation structure are more spaced apart in the second pixel region or the third pixel region than in the first pixel region.

9. The method of claim 7, further comprising:
forming a plurality of micro-lenses over the array of color filters, such that each of the plurality of micro-lenses directly overlies a corresponding color filter, wherein each micro-lens of the first pixel region has an area that is smaller than each micro-lens of the second pixel region or the third pixel region, as viewed from above.

10. The method of claim 7, wherein the first pixel region takes up a smaller area across the plurality of pixel regions than the second pixel region and the third pixel region combined, as viewed from above.

11. The method of claim 7, further comprising:
forming a plurality of doped isolation wells over the semiconductor substrate comprising a first doped isolation well, a second doped isolation well, and a third doped isolation well, wherein the first doped isolation well and the second doped isolation well are spaced closer together compared to the second doped isolation well and the third doped isolation well.

12. An image sensor, comprising:
a semiconductor substrate;
a first photodiode disposed in the semiconductor substrate and corresponding to a first pixel region;
a second photodiode disposed in the semiconductor substrate and corresponding to a second pixel region, the second photodiode spaced laterally apart from the first photodiode;

a third photodiode disposed in the semiconductor substrate and corresponding to a third pixel region, the third photodiode spaced laterally apart from the first photodiode;

a deep trench isolation (DTI) structure extending into the semiconductor substrate as viewed in cross-section and defining a closed loop that laterally surrounds the first pixel region, the second pixel region, and the third pixel region, as viewed from above; and wherein the DTI structure includes a first linear segment that extends from a first edge of the closed loop to a second edge of the closed loop that is opposite the first edge, wherein the first and third pixel regions are on a first side of the first linear segment and the second pixel region is on a second side of the first linear segment; and wherein the DTI structure further includes a second linear segment that extends perpendicularly from the first side of the first linear segment to a third edge of the closed loop, the second linear segment lying on a line that intersects an upper edge of the second pixel region, and a third linear segment that extends perpendicularly from the second side of the first linear segment to a fourth edge of the closed loop, and the third linear segment lying on a line that intersects a lower edge of the third pixel region.

13. The image sensor of claim 12, further comprising:
a first micro lens and a second micro lens over the first photodiode and the second photodiode, respectively, wherein the first micro lens has a first width and the second micro lens has a second width when viewed from a cross section, the first width being less than the second width.

14. The image sensor of claim 13, wherein the first micro lens has a curvature that is different than a curvature of the second micro lens.

15. The image sensor of claim 13, further comprising:
a first color filter and a second color filter disposed below the first micro lens and the second micro lens, respectively.

16. The image sensor of claim 15, wherein the first color filter has the first width and the second color filter has the second width when viewed from the cross section.

17. The image sensor of claim 13, wherein the first micro lens and the second micro lens have equal heights when viewed from the cross section.

18. The image sensor of claim 13, wherein the first linear segment, the second linear segment, and the third linear segment have respective widths that are equal to one another.

19. The image sensor of claim 12, wherein the first linear segment extends from a first doped isolation well to a top surface of the semiconductor substrate.

20. The image sensor of claim 13, wherein the first linear segment is directly beneath a lateral interface where the first micro lens contacts the second micro lens when viewed from the cross section.

* * * * *